US010569381B2

(12) United States Patent
Yoshida

(10) Patent No.: US 10,569,381 B2
(45) Date of Patent: Feb. 25, 2020

(54) POLISHING METHOD AND POLISHING APPARATUS

(71) Applicant: Ebara Corporation, Tokyo (JP)

(72) Inventor: Hiroshi Yoshida, Tokyo (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 15/761,989

(22) PCT Filed: Jul. 13, 2016

(86) PCT No.: PCT/JP2016/070654
§ 371 (c)(1),
(2) Date: Mar. 21, 2018

(87) PCT Pub. No.: WO2017/056636
PCT Pub. Date: Apr. 6, 2017

(65) Prior Publication Data
US 2018/0264619 A1    Sep. 20, 2018

(30) Foreign Application Priority Data

Sep. 28, 2015 (JP) .................. 2015-189316

(51) Int. Cl.
*B24B 37/005* (2012.01)
*B24B 37/013* (2012.01)
(Continued)

(52) U.S. Cl.
CPC .......... *B24B 37/005* (2013.01); *B24B 37/013* (2013.01); *B24B 37/042* (2013.01);
(Continued)

(58) Field of Classification Search
CPC combination set(s) only.
See application file for complete search history.

(56) References Cited

U.S. PATENT DOCUMENTS 6,290,584 B1    9/2001 Kim et al.
6,585,572 B1    7/2003 Saldana et al.
(Continued)

FOREIGN PATENT DOCUMENTS

CN    1447734 A    10/2003
CN    101007396 A    8/2007
(Continued)

OTHER PUBLICATIONS

Japanese Patent Office, International Search Report in International Application No. PCT/JP2016/070654 (dated Aug. 23, 2016).

*Primary Examiner* — Ratisha Mehta
(74) *Attorney, Agent, or Firm* — Leydig, Voit & Mayer, Ltd.

(57) ABSTRACT

The present invention relates to a method and an apparatus for polishing a surface of a substrate having a film whose thickness varies along a circumferential direction of the substrate. The polishing method includes: obtaining a film-thickness distribution in a circumferential direction of a substrate (W); determining a first area having a maximum or minimum film thickness based on the film-thickness distribution; rotating a polishing table (3) holding a polishing pad (2); pressing a surface of the substrate (W) against the polishing pad (2) while rotating the substrate by a polishing head (1); and polishing the first area at a removal rate different from that of a second area in the surface of the substrate (W).

4 Claims, 35 Drawing Sheets

(51) Int. Cl.
  *B24B 49/12* (2006.01)
  *H01L 21/66* (2006.01)
  *B24B 37/32* (2012.01)
  *B24B 49/10* (2006.01)
  *B24B 37/34* (2012.01)
  *B24B 37/30* (2012.01)
  *B24B 49/04* (2006.01)
  *B24B 37/04* (2012.01)
  *B24B 37/10* (2012.01)
  *H01L 21/306* (2006.01)

(52) U.S. Cl.
  CPC ............ *B24B 37/107* (2013.01); *B24B 37/30* (2013.01); *B24B 37/32* (2013.01); *B24B 37/34* (2013.01); *B24B 49/04* (2013.01); *B24B 49/105* (2013.01); *B24B 49/12* (2013.01); *H01L 21/30625* (2013.01); *H01L 22/20* (2013.01); *H01L 22/26* (2013.01); *H01L 22/12* (2013.01)

(56) References Cited

U.S. PATENT DOCUMENTS

| | | | |
|---|---|---|---|
| 7,025,658 | B2 | 4/2006 | David |
| 8,246,417 | B2 | 8/2012 | Kobayashi et al. |
| 2002/0037685 | A1 | 3/2002 | Matsuo et al. |
| 2010/0015889 | A1 | 1/2010 | Shimizu et al. |
| 2012/0058709 | A1* | 3/2012 | Fukushima ............ B24B 37/015 451/5 |
| 2015/0118944 | A1* | 4/2015 | Kosuge ................... B24B 37/34 451/287 |
| 2016/0074989 | A1 | 3/2016 | Fukushima et al. |

FOREIGN PATENT DOCUMENTS

| | | |
|---|---|---|
| CN | 101511539 A | 8/2009 |
| JP | 2002-079454 A | 3/2002 |
| JP | 2002-103211 A | 4/2002 |
| JP | 2002-210653 A | 7/2002 |
| JP | 2012-076157 A | 4/2012 |
| JP | 2016-059991 A | 4/2016 |
| WO | WO 2008/044786 A1 | 4/2006 |

* cited by examiner

FIG.9
| RADIAL POSITION −150mm ~ 0mm | | RADIAL POSITION 0mm ~ 150mm | |
|---|---|---|---|
| ANGLE OF ROTATION | FILM-THICKNESS INDEX VALUE | ANGLE OF ROTATION | FILM-THICKNESS INDEX VALUE |
| 0° | 390 | 225° | 360 |
FIG.10
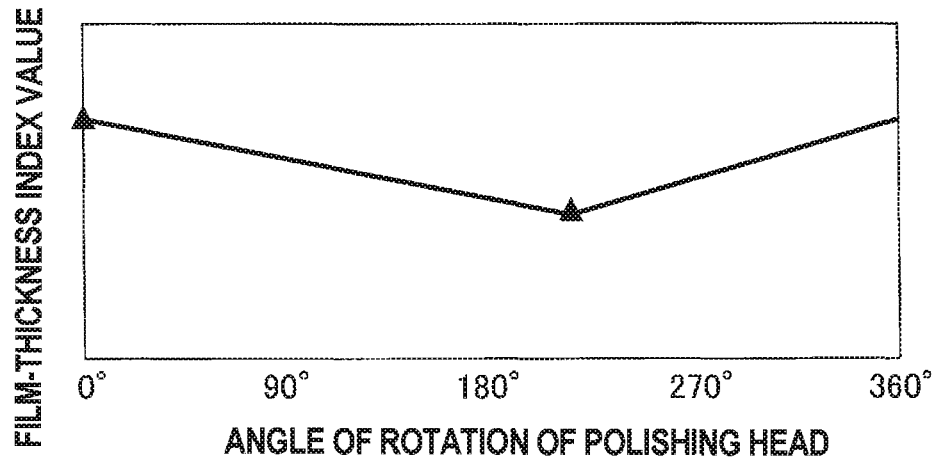
FIG.11
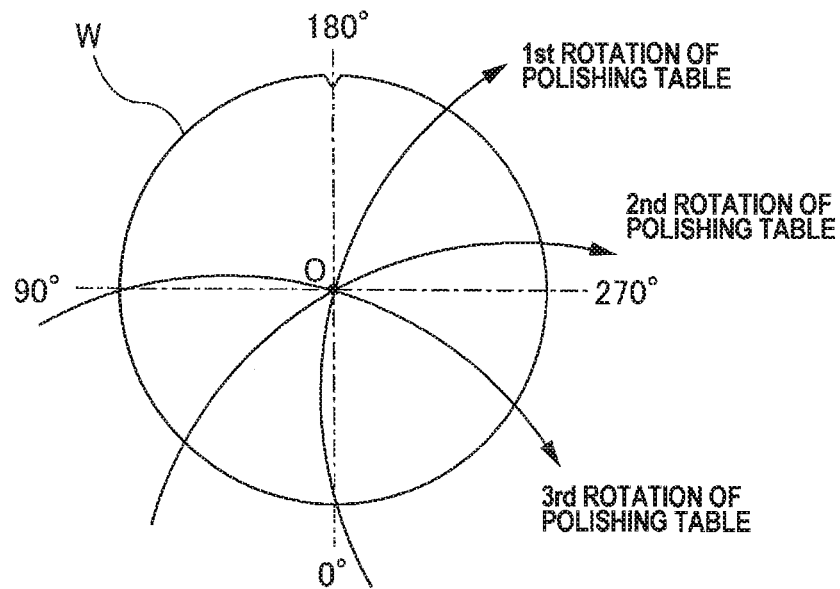

FIG.12
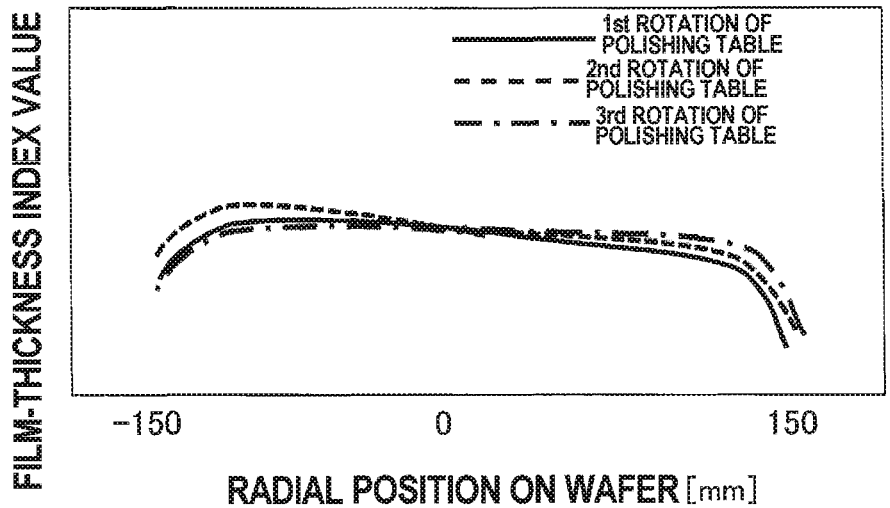
FIG.13
| | RADIAL POSITION −150mm ~ 0mm | | RADIAL POSITION 0mm ~ 150mm | |
|---|---|---|---|---|
| NUMBER OF TABLE ROTATIONS | ANGLE OF ROTATION | FILM-THICKNESS INDEX VALUE | ANGLE OF ROTATION | FILM-THICKNESS INDEX VALUE |
| 1 | 0° | 390 | 225° | 360 |
| 2 | 45° | 400 | 270° | 380 |
| 3 | 90° | 387 | 315° | 382 |
| 4 | 135° | 375 | 0° | 388 |
| ~ | XX | XX | XX | XX |
FIG.14
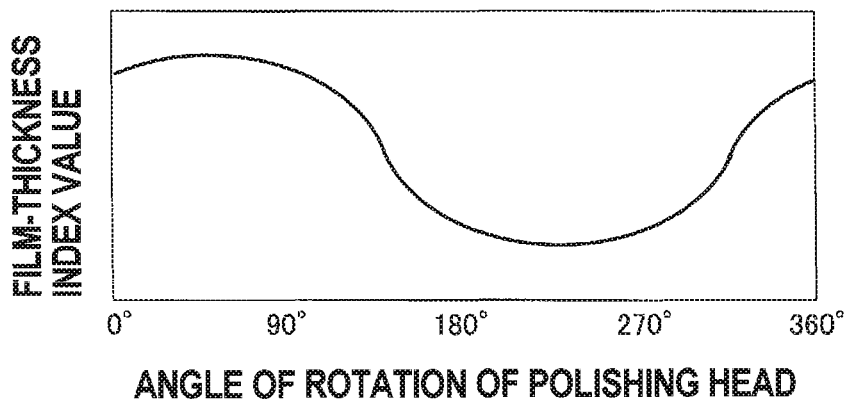

POLISHING METHOD AND POLISHING APPARATUS

CROSS-REFERENCE TO RELATED APPLICATIONS

This patent application is the U.S. national phase of International Application No. PCT/JP2016/070654, filed Jul. 13, 2016, which claims the benefit of Japanese Patent Application No. 2015-189316, filed on Sep. 28, 2015, which are incorporated by reference in their entireties herein.

TECHNICAL FIELD

The present invention relates to a polishing method and a polishing apparatus for polishing a surface of a substrate such as a wafer, and more particularly to a method and an apparatus for polishing a surface of a substrate having a film whose thickness varies along a circumferential direction of the substrate.

BACKGROUND ART

In the manufacturing of a semiconductor device, a various kinds of films are formed on a wafer. After a film forming process, the wafer is polished in order to remove an unnecessary portion of a film or surface irregularities. Chemical mechanical polishing (CMP) is a typical wafer polishing technique. A CMP process is performed by rubbing a wafer against a polishing surface while supplying slurry onto the polishing surface. A film, which has been formed on the wafer, is polished by the combined effect of the mechanical action of abrasive grains contained in the slurry and the chemical action of a chemical component of the slurry.

CITATION LIST

Patent Literature

Patent document 1: Japanese laid-open patent publication No. 2002-079454
Patent document 2: U.S. Pat. No. 7,025,658

SUMMARY OF INVENTION

Technical Problem

Processes for forming films on a wafer are performed by using various film forming techniques, such as plating, chemical vapor deposition (CVD), physical vapor deposition (PVD), etc. Such film forming techniques may fail to form a film uniformly over an entire surface of a wafer. For example, film thickness may vary along the circumferential direction of the wafer, or a film can be formed in an oblique shape in its entirety. Especially in a case of forming a film on a plurality of wafers by using a plurality of film-forming devices, the distribution of the film thickness can vary among the wafers. Conventional CMP techniques, however, cannot eliminate such a variation in the film thickness along the circumferential direction of the wafer.

It is therefore an object of the present invention to provide a polishing method and a polishing apparatus which can eliminate variation in thickness of a film along a circumferential direction of a substrate such as a wafer, and which can obtain the same film-thickness distribution among a plurality of substrates despite the variation in the film-thickness distribution among the substrates.

Solution to Problem

In order to accomplish the above object, according to one aspect of the present invention, there is provided a polishing method comprising: obtaining a film-thickness distribution in a circumferential direction of a substrate; determining a first area having a maximum or minimum film thickness based on the film-thickness distribution; rotating a polishing table holding a polishing pad; pressing a surface of the substrate against the polishing pad while rotating the substrate by a polishing head; and polishing the first area at a removal rate different from that of a second area in the surface of the substrate.

According to a preferred aspect of the present invention, the first area and the second area are symmetrical with respect to a center of the substrate.

According to a preferred aspect of the present invention, pressing the surface of the substrate against the polishing pad comprises pressing the surface of the substrate against the polishing pad by the polishing head, while rotating the substrate by the polishing head, the polishing head having been decentered in a direction in which a distance of the first area from a central axis of rotation of the polishing head increases or decreases.

According to a preferred aspect of the present invention, polishing the first area at a removal rate different from that of the second area in the surface of the substrate comprises polishing the first area at a removal rate different from that of the second area by increasing or decreasing a load applied from the polishing head to an entirety of the surface of the substrate when the first area is located outwardly of the second area in a radial direction of the polishing table.

According to a preferred aspect of the present invention, polishing the first area at a removal rate different from that of the second area in the surface of the substrate comprises polishing the first area at a removal rate different from that of the second area by increasing or decreasing a local load applied from the polishing head to the first area when the first area is located outwardly of the second area in a radial direction of the polishing table.

According to a preferred aspect of the present invention, polishing the first area at a removal rate different from that of the second area in the surface of the substrate comprises polishing the first area at a removal rate different from that of the second area by moving the polishing head, together with the substrate, outwardly or inwardly in the radial direction of the polishing table when the first area is located outwardly of the second area in the radial direction of the polishing table.

According to a preferred aspect of the present invention, pressing the surface of the substrate against the polishing pad comprises pressing the surface of the substrate against the polishing pad with an elastic membrane of the polishing head, while rotating the substrate by the polishing head, the polishing head having a membrane holder holding the elastic membrane, the membrane holder being inclined upward or downward in a direction from the first area toward the second area.

According to another aspect of the present invention, there is provided a polishing method comprising: obtaining a film-thickness distribution in a circumferential direction of a substrate; determining a first area having a maximum or minimum film thickness based on the film-thickness distribution; rotating a substrate stage holding the substrate;

pressing a polishing disk against a surface of the substrate while rotating the polishing disk; and polishing the first area at a removal rate different from that of a second area in the surface of the substrate.

According to a preferred aspect of the present invention, the first area and the second area are symmetrical with respect to a center of the substrate.

According to a preferred aspect of the present invention, polishing the first area at a removal rate different from that of the second area in the surface of the substrate comprises polishing the first area at a removal rate different from that of the second area in the surface of the substrate by increasing a relative speed between the first area and the polishing disk when the polishing disk is in contact with the first area.

According to a preferred aspect of the present invention, polishing the first area at a removal rate different from that of the second area in the surface of the substrate comprises polishing the first area at a removal rate different from that of the second area in the surface of the substrate by increasing a load of the polishing disk when the polishing disk is in contact with the first area.

According to another aspect of the present invention, there is provided a polishing method comprising: obtaining a first film-thickness distribution which indicates a film-thickness distribution in a circumferential direction of a substrate; determining a first area having a maximum or minimum film thickness based on the first film-thickness distribution; rotating a polishing table holding a polishing pad; pressing a surface of the substrate against the polishing pad while rotating the substrate by a polishing head; performing a first-stage polishing process of polishing the first area at a removal rate different from that of a second area in the surface of the substrate; obtaining a second film-thickness distribution which indicates a film-thickness distribution in the circumferential direction of the polished substrate; determining a third area having a maximum or minimum film thickness based on the second film-thickness distribution; rotating a substrate stage holding the substrate; pressing a polishing disk against the surface of the substrate while rotating the polishing disk; and performing a second-stage polishing process of polishing the third area at a removal rate different from that of a fourth area in the surface of the substrate.

According to a preferred aspect of the present invention, the first area and the second area are symmetrical with respect to a center of the substrate, and the third area and the fourth area are symmetrical with respect to the center of the substrate.

According to another aspect of the present invention, there is provided a polishing apparatus comprising: a polishing table supporting a polishing pad; a polishing head configured to press a substrate against the polishing pad; a head rotating motor configured to rotate the polishing head about a central axis of rotation; and a head-decentering mechanism configured to decenter the polishing head from the central axis of rotation.

According to a preferred aspect of the present invention, the head-decentering mechanism is configured to decenter the polishing head in a direction in which a distance of a first area in a surface of the substrate from the central axis of rotation of the polishing head increases or decreases such that the polishing head can polish the first area at a removal rate different from that of a second area in the surface of the substrate.

According to a preferred aspect of the present invention, the first area and the second area are symmetrical with respect to a center of the substrate.

According to another aspect of the present invention, there is provided a polishing apparatus comprising: a polishing table supporting a polishing pad; and a polishing head configured to press a substrate against the polishing pad, the polishing head including: a head body; an elastic membrane configured to press the substrate against the polishing pad; a membrane holder holding the elastic membrane; at least three partition membranes that form at least three actuating chambers between the head body and the membrane holder; and at least three pressure regulators configured to control pressures in the at least three actuating chambers independently of each other to incline the membrane holder in a desired direction.

According to a preferred aspect of the present invention, the membrane holder is inclined upwardly or downwardly in a direction from a first area toward a second area in a surface of the substrate to enable the polishing head to polish the first area at a removal rate different from that of the second area.

According to a preferred aspect of the present invention, the first area and the second area are symmetrical with respect to a center of the substrate.

Advantageous Effects of Invention

According to the present invention, the difference in film thickness between the first area and the second area can be reduced by polishing the first area at a removal rate different from that of the second area. Typically, the film thickness of the first area can be equal to the film thickness of the second area. Thus, the polishing method according to the present invention can eliminate the variation in film thickness along a circumferential direction of a substrate.

BRIEF DESCRIPTION OF DRAWINGS

FIG. 9 is a data table showing a relationship between angle of rotation of the polishing head and corresponding film-thickness index value;

FIG. 10 is a film-thickness distribution graph showing a relationship between angle of rotation of the polishing head and corresponding film-thickness index value;

FIG. 11 is a diagram illustrating an embodiment in which the film-thickness sensor sweeps across a wafer surface a plurality of times to obtain film-thickness profiles;

FIG. 12 is a diagram showing film-thickness profiles produced from film-thickness index values;

FIG. 13 is a data table showing a relationship between angle of rotation of the polishing head and corresponding film-thickness index value in each rotation of the polishing table;

FIG. 14 is a graph showing a relationship between angle of rotation of the polishing head and corresponding film-thickness index value;

DESCRIPTION OF EMBODIMENTS

Figure 1:
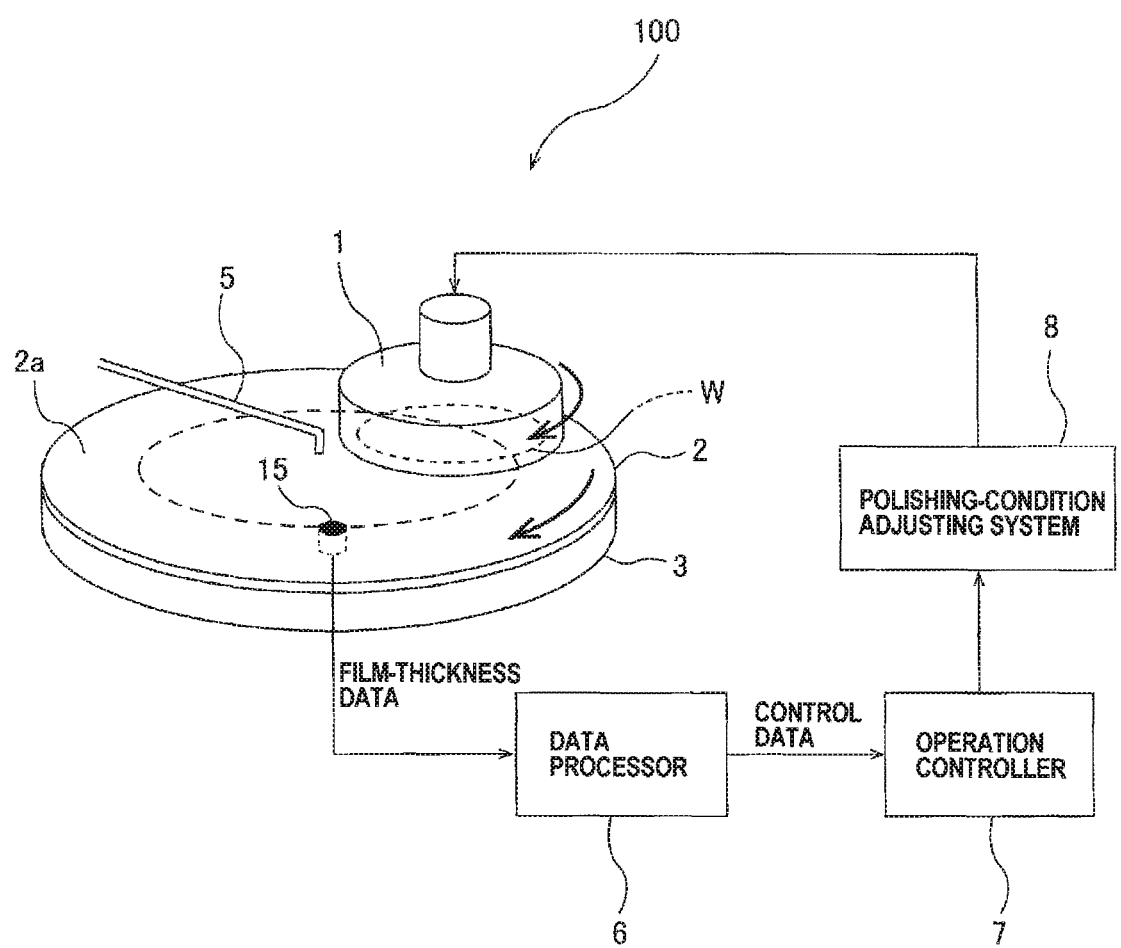
FIG. 1 is a perspective view showing an embodiment of a CMP (Chemical Mechanical Polishing) apparatus.

Embodiments of the present invention will be now described below with reference to the drawings. FIG. 1 is a perspective view showing an embodiment of a CMP (chemical mechanical polishing) apparatus which is a main polishing apparatus for chemically mechanically polishing an entirety of a surface of a substrate, such as a wafer. As shown in FIG. 1, the CMP apparatus 100 as the main polishing apparatus includes a polishing head (or a substrate holder) 1 for holding and rotating a wafer W which is an example of a substrate, a polishing table 3 supporting a polishing pad 2 thereon, and a slurry supply nozzle 5 for supplying slurry onto the polishing pad 2. The polishing pad 2 has an upper surface which provides a polishing surface 2a for polishing the wafer W.

The polishing head 1 is configured to be able to hold the wafer W on its lower surface by vacuum suction. The polishing head 1 presses the wafer W against the polishing surface 2a of the polishing pad 2, while the polishing head 1 and the polishing table 3 are rotating in the same direction as indicated by arrows. The polishing surface 2a is larger than the surface of the wafer W, and the entirety of the surface of the wafer W are pressed against the polishing surface 2a. The slurry is supplied from the slurry supply nozzle 5 onto the polishing pad 2, so that the wafer W is rubbed against the polishing surface 2a of the polishing pad 2 in the presence of the slurry. The surface of the wafer W is polished by the combination of the mechanical action of abrasive grains contained in the slurry and the chemical action of a chemical component of the slurry.

At least one film-thickness sensor 15 for measuring a film thickness of the wafer W is disposed in the polishing table 3. This film-thickness sensor 15 is an eddy current sensor or an optical sensor, and is configured to produce a film-thickness index value that varies in accordance with the film thickness of the wafer W. The film-thickness index value is a value indicating a film thickness directly or indirectly. The film-thickness sensor 15 is rotated together with the polishing table 3. Each time the polishing table 3 makes one revolution, the film-thickness sensor 15 measures the film thickness at a plurality of measurement points, including the center of the wafer W, on the wafer W, and outputs the above-described film-thickness index values.

The film-thickness sensor 15 is coupled to a data processor 6. The film-thickness index values obtained at the plurality of measurement points on the surface of the wafer W are transmitted as film-thickness data to the data processor 6. This data processor 6 produces a film-thickness profile from the film-thickness data, and further produces a film-thickness distribution from the film-thickness profile. In this specification, the film-thickness profile represent a relationship between the film-thickness index value (i.e., the film thickness) and radial position on the wafer W, and the film-thickness distribution represent a distribution of the film-thickness index values (i.e., a film-thickness distribution) in a circumferential direction of the wafer W.

The data processor 6 is coupled to an operation controller 7. This operation controller 7 is configured to determine a polishing condition based on the film-thickness distribution. More specifically, the operation controller 7 is configured to determine a polishing condition that can bring a current film-thickness distribution closer to a target film-thickness distribution. The operation controller 7 is coupled to a polishing-condition adjusting system 8, and is configured to control operations of the polishing-condition adjusting system 8. This polishing-condition adjusting system 8 includes a pressure regulator, a head pivoting motor, and a head-decentering mechanism, which will be described later.

Figure 2:
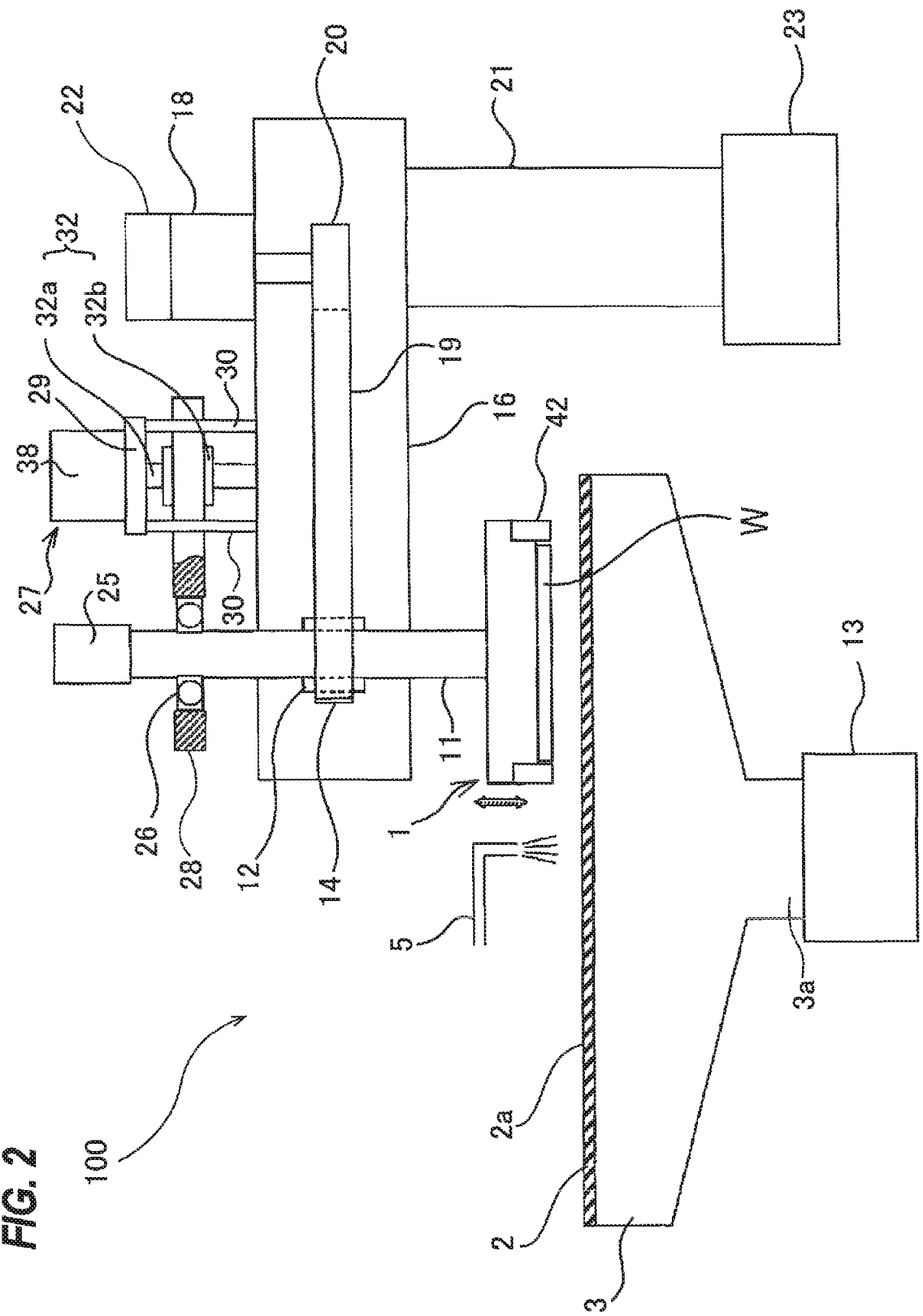
FIG. 2 is a diagram showing in detail a construction of the CMP apparatus.

FIG. 2 is a view showing a detailed structure of the CMP apparatus 100. The polishing table 3 is coupled to a table motor 13 through a table shaft 3a, and is rotated about the table shaft 3a by the table motor 13 which is disposed below the polishing table 3. The polishing pad 2 is attached to an upper surface of the polishing table 3. When the polishing table 3 is rotated by the table motor 13, the polishing surface 2a moves relative to the polishing head 1. Therefore, the table motor 13 serves as a polishing-surface moving mechanism for moving the polishing surface 2a horizontally.

The polishing head 1 is coupled to a head shaft 11, which is vertically movable relative to a head arm 16 by a vertically moving mechanism 27. The vertical movement of the head shaft 11 causes a vertical movement of the entirety of the polishing head 1 relative to the head arm 16 and enables positioning of the polishing head 1. A rotary joint 25 is mounted to an upper end of the head shaft 11.

The vertically moving mechanism 27 for elevating and lowering the head shaft 11 and the polishing head 1 includes a bridge 28 for rotatably supporting the head shaft 11 through a bearing 26, a ball screw 32 mounted to the bridge 28, a support base 29 supported by pillars 30, and a servomotor 38 mounted to the support base 29. The support base 29 for supporting the servomotor 38 is secured to the head arm 16 through the pillars 30.

The ball screw 32 has a screw shaft 32a coupled to the servomotor 38, and a nut 32b which is in engagement with the screw shaft 32a. The head shaft 11 is configured to move vertically together with the bridge 28. Therefore, when the servomotor 38 is set in motion, the bridge 28 moves vertically through the ball screw 32 to cause the head shaft 11 and the polishing head 1 to move vertically.

The head shaft 11 is further coupled to a rotary cylinder 12 through a key (not shown). This rotary cylinder 12 has a timing pulley 14 on its outer circumferential surface. A head rotating motor 18 is secured to the head arm 16, and the timing pulley 14 is coupled through a timing belt 19 to a timing pulley 20 which is secured to the head rotating motor 18. Therefore, when the head rotating motor 18 is set in motion, the rotary cylinder 12 and the head shaft 11 are rotated together through the timing pulley 20, the timing belt 19, and the timing pulley 14, thus rotating the polishing head 1 about its own axis. The head rotating motor 18, the timing pulley 20, the timing belt 19, and the timing pulley 14 constitute a polishing-head rotating mechanism for rotating the polishing head 1 about its own axis. The head arm 16 is supported by a head arm shaft 21, which is rotatably supported by a frame (not shown).

A rotary encoder 22, which is a rotation-angle detector, is mounted to the head rotating motor 18. This rotary encoder 22 is configured to detect an angle of rotation of the polishing head 1 coupled to the head rotating motor 18. The rotary encoder 22 is coupled to the data processor 6 shown in FIG. 1, so that the angle of rotation of the polishing head 1, detected by the rotary encoder 22, is transmitted to the data processor 6.

The polishing head 1 is configured to be able to hold a substrate, such as the wafer W, on its lower surface. The head arm 16 can pivot around the head arm shaft 21, which is coupled to a head pivoting motor 23. This head pivoting motor 23 is configured to rotate the head arm shaft 21 through a predetermined angle in a clockwise direction and a counterclockwise direction. Therefore, when the head pivoting motor 23 is set in motion, the polishing head 1 and the head arm 16 pivots around the head arm shaft 21.

Polishing of the wafer W is performed as follows. The polishing head 1, holding the wafer W on its lower surface, is moved from a receiving position of the wafer W to a position above the polishing table 3 by the pivotal movement of the head arm 16. The polishing head 1 and the polishing table 3 are rotated individually, while the slurry is supplied onto the polishing pad 2 from the slurry supply nozzle 5 disposed above the polishing table 3. The polishing head 1 is lowered and then presses the wafer W against the polishing surface 2a of the polishing pad 2. In this manner, the wafer W is placed in sliding contact with the polishing surface 2a of the polishing pad 2, whereby the surface of the wafer W is polished.

Figure 3:
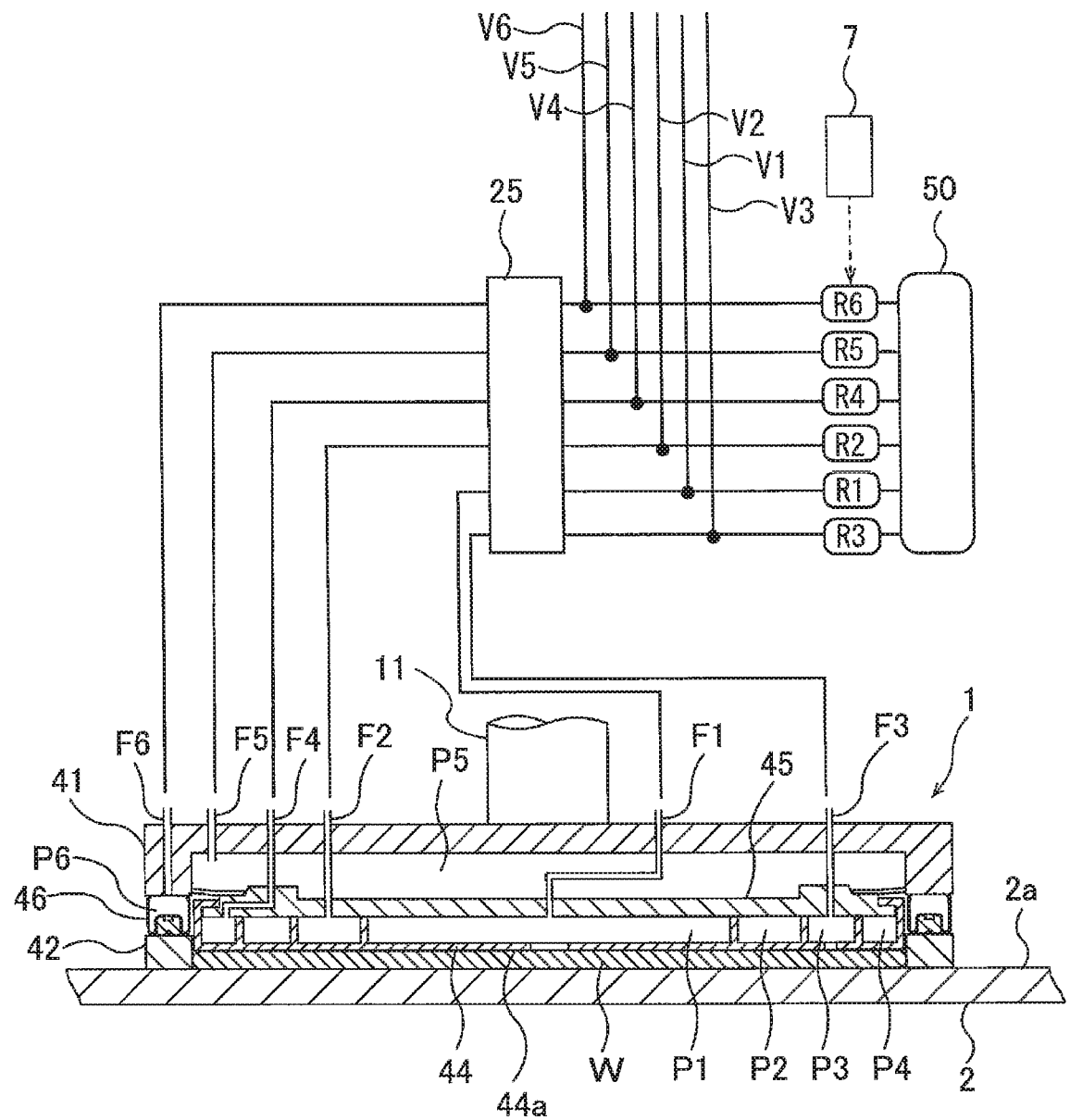
FIG. 3 is a cross-sectional view of a polishing head.

The polishing head 1, constituting a substrate holder, will now be described. In this embodiment, the polishing head 1 is configured to be capable of varying pressing force for different areas of the wafer W. FIG. 3 is a cross-sectional view of the polishing head 1. As shown in FIG. 3, the polishing head 1 includes a head body 41 coupled to the head shaft 11, and a retainer ring 42 disposed below the head body 41.

An elastic membrane 44, which is to make contact with the upper surface (opposite to the surface to be polished) of the wafer W, and a membrane holder 45 holding the elastic membrane 44 are disposed below the head body 41. The elastic membrane 44 has a wafer contact surface (or a substrate contact surface) 44a which is to make contact with the upper surface of the wafer W. The wafer contact surface (substrate contact surface) 44a has a circular shape and can press the wafer W against the polishing surface 2a of the polishing pad 2.

Four pressure chambers P1, P2, P3, P4 are provided between the elastic membrane 44 and the membrane holder 45. The pressure chambers P1, P2, P3, P4 are formed by the elastic membrane 44 and the membrane holder 45. The central pressure chamber P1 has a circular shape, and the other pressure chambers P2, P3, P4 each have an annular shape. The pressure chambers P1, P2, P3, P4 are arranged concentrically.

A pressurized gas, such as pressurized air, is supplied from a gas supply source 50 to the pressure chambers P1, P2, P3, P4 via gas delivery lines F1, F2, F3, F4, respectively. Vacuum lines V1, V2, V3, V4 are coupled to the gas delivery lines F1, F2, F3, F4 so that a negative pressure is created in each of the pressure chambers P1, P2, P3, P4 by the vacuum lines V1, V2, V3, V4. The pressures in the pressure chambers P1, P2, P3, P4 can be changed independently of each other, and therefore polishing pressures on the corresponding four areas of the wafer W, i.e. the central area, the inner intermediate area, the outer intermediate area, and the peripheral area, can be adjusted independently.

A pressure chamber P5 is formed between the membrane holder 45 and the head body 41. A pressurized gas is supplied from the gas supply source 50 to the pressure chamber P5 via a gas delivery line F5. A Vacuum line V5 is coupled to the gas delivery line F5 so that a negative pressure is created in the pressure chamber P5 by the vacuum line V5. This enables the entireties of the membrane holder 45 and the elastic membrane 44 to move vertically.

The peripheral edge of the wafer W is surrounded by the retainer ring 42 so that the wafer W will not come out of the polishing head 1 during polishing. An opening is formed in that portion of the elastic membrane 44 which constitutes the pressure chamber P3 so that by creating a vacuum in the pressure chamber P3, the wafer W will be held by suction on the polishing head 1. The wafer W will be released from the polishing head 1 by supplying a gas, such as nitrogen gas or clean air, to the pressure chamber P3.

An annular rolling diaphragm 46, having a pressure chamber P6 formed in its interior, is disposed between the head body 41 and the retainer ring 42. The pressure chamber P6 is coupled to the gas supply source 50 via a gas delivery line F6. The gas supply source 50 supplies a pressurized gas into the pressure chamber P6, thereby pressing the retainer ring 42 against the polishing pad 2. A vacuum line V6 is coupled to the gas delivery line F6 so that a negative pressure is created in the pressure chamber P6 by the vacuum line V6. When a vacuum is created in the pressure chamber P6, the entirety of the retainer ring 42 moves upward.

The gas delivery lines F1, F2, F3, F4, F5, F6, communicating with the pressure chambers P1, P2, P3, P4, F5, F6, are provided with pressure regulators R1, R2, R3, R4, R5, R6, respectively. The pressurized gas supplied from the gas supply source 50 passes through the pressure regulators R1 to R6, and is supplied into the pressure chambers P1 to P6. The pressure regulators R1 to R6 are coupled to the pressure chambers P1 to P6 by the gas delivery lines F1 to F6, respectively. The gas delivery lines F1 to F6 extend from the pressure chambers P1 to P6 to the gas supply source 50 via the rotary joint 25 and the pressure regulators R1 to R6.

The pressure regulators R1 to R6 each regulate the pressure of the pressurized gas supplied from the gas supply source 50, thereby controlling the respective pressures in the pressure chambers P1 to P6. The pressure regulators R1 to R6 are coupled to the operation controller 7 shown in FIG. 1. The pressure chambers P1 to P6 are also coupled to vent valves (not shown) so that the pressure chambers P1 to P6 can be opened to the atmosphere.

The operation controller 7 is configured to set target pressure values for the pressure chambers P1 to P4, respectively, based on the film-thickness profile and the film-thickness distribution that have been produced from the film-thickness data, and operate the pressure regulators R1 to R4 so that the pressures in the pressure chambers P1 to P4 are maintained at the corresponding target pressure values. Since the pressure chambers P1 to P4 are arranged concentrically, a variation in the film thickness along the radial direction of the wafer W can be eliminated; however, a variation in the film thickness along the circumferential direction of the wafer W cannot be eliminated.

Thus, in this embodiment, the CMP apparatus 100, which is the main polishing apparatus, eliminates the variation in the film thickness along the circumferential direction of the wafer W in the following manner. At the outset, an association process for associating the orientation of the wafer W with an angle of rotation of the polishing head 1 is performed prior to polishing of the wafer W. This association process is carried out by using a cut detection sensor 51 for detecting a notch (or a cut) formed in the periphery of the wafer W.

Figure 4:
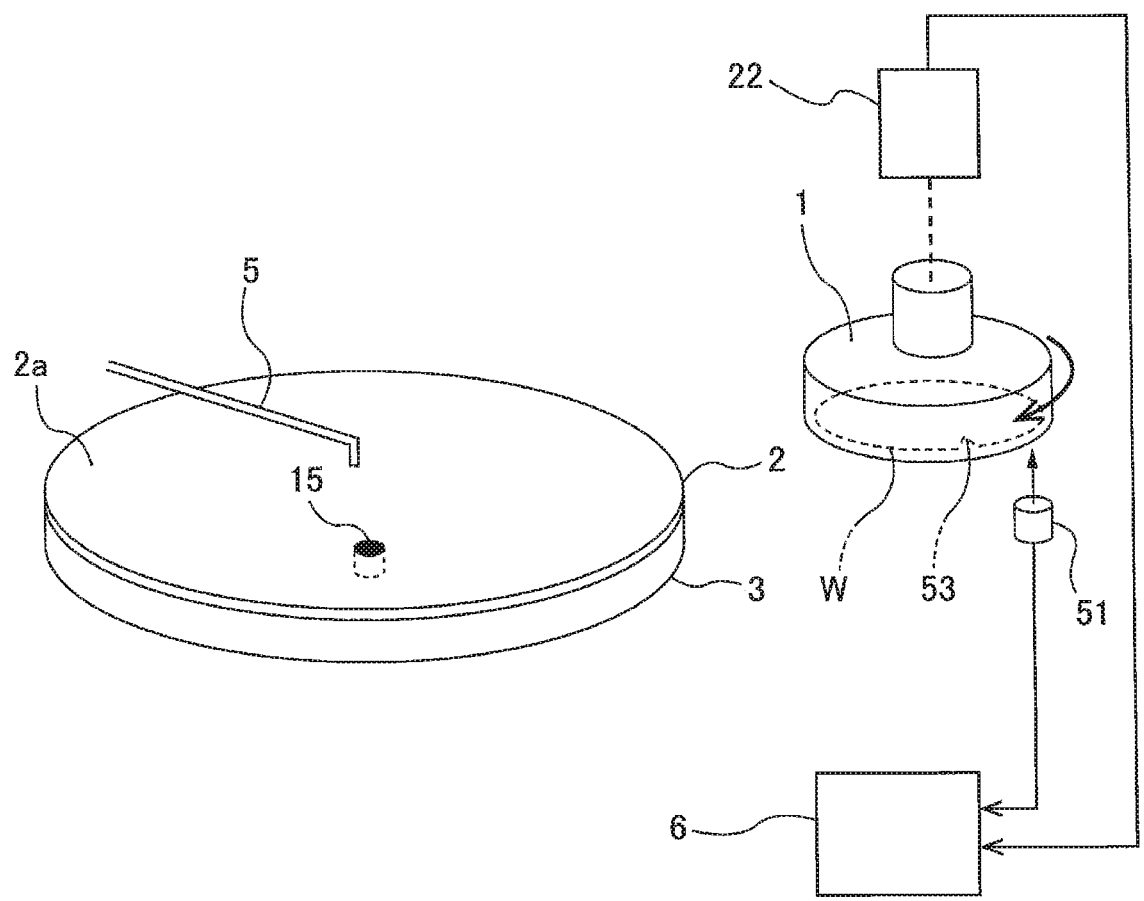
FIG. 4 is a diagram illustrating an embodiment in which a cut detection sensor for detecting a notch of a wafer is disposed beside a polishing table.

In one embodiment, as shown in FIG. 4, the cut detection sensor 51 is disposed beside the polishing table 3. The polishing head 1 holds the wafer W, and is moved by the head pivoting motor 23 until the periphery of the wafer W reaches a position above the cut detection sensor 51. Next, while the polishing head 1 and the wafer W are rotated about the axis of the polishing head 1, a notch (or cut) 53 of the wafer W is detected by the cut detection sensor 51. The angle of rotation of the polishing head 1 (i.e. the angle of rotation of the wafer W) is measured by the rotary encoder 22 shown in FIG. 2, and a measured value of the angle of rotation of the polishing head 1 is transmitted to the data processor 6. The cut detection sensor 51 is coupled to the data processor 6, and an output signal of the cut detection sensor 51 is transmitted to the data processor 6.

Figure 5:
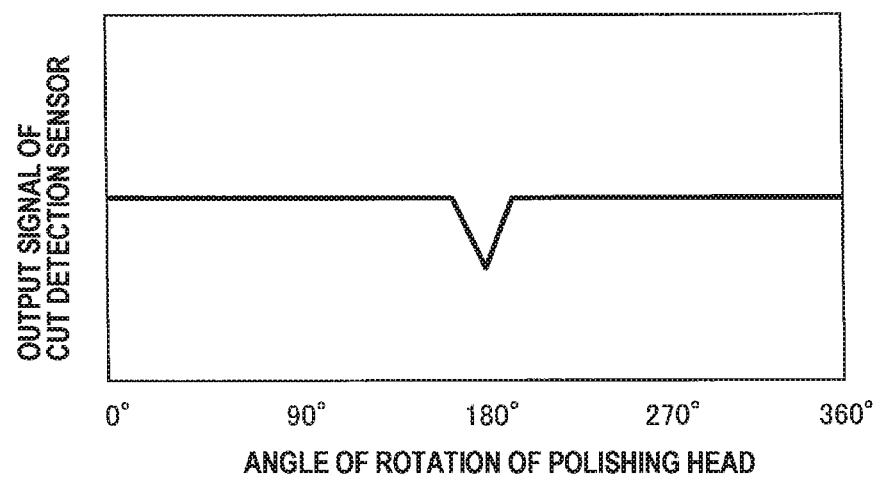
FIG. 5 is a graph showing a relationship between output signal of the cut detection sensor and angle of rotation of a polishing head.

FIG. 5 is a graph showing a relationship between the output signal of the cut detection sensor 51 and the angle of rotation of the polishing head 1. The data processor 6 can obtain a relationship between the output signal of the cut detection sensor 51 and the angle of rotation of the polishing head 1, such as the one shown in FIG. 5. Based on a change in the output signal of the cut detection sensor 51, the data processor 6 determines an angle of rotation of the polishing head 1 which indicates the position of the notch 53. In the example shown in FIG. 5, the output signal of the cut detection sensor 51 makes a significant change when the angle of rotation of the polishing head 1 is 180 degrees. Therefore, the data processor 6 determines that the angle of rotation of the polishing head 1, which indicates the position of the notch 53, is 180 degrees. By using the position of the notch 53 as a reference, the data processor 6 can indicate the orientation of the wafer W in terms of the angle of rotation of the polishing head 1.

The cut detection sensor 51 may be comprised of an eddy-current sensor, an optical sensor, an image sensor, or the like. It is also possible to use the film-thickness sensor 15, disposed in the polishing table 3, as a cut detection sensor. In that case, there is no need to provide the cut detection sensor 51 beside the polishing table 3.

Figure 6:
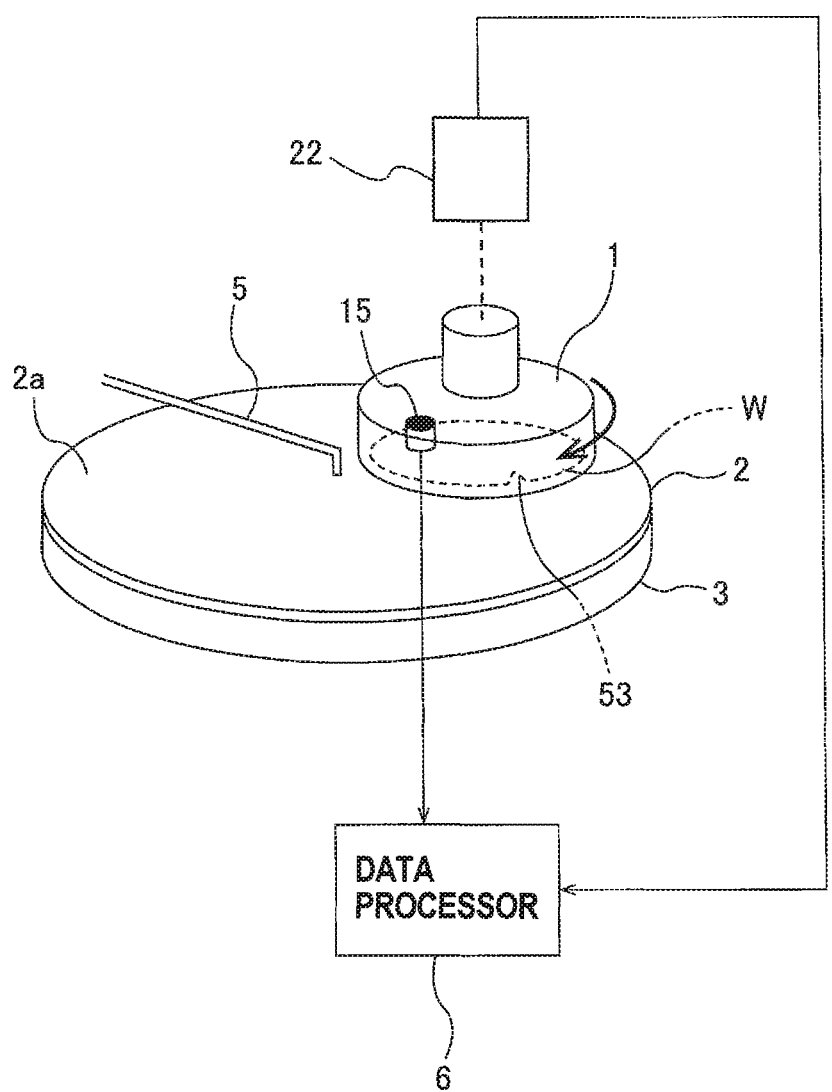
FIG. 6 is a diagram illustrating an embodiment in which a film-thickness sensor, disposed in the polishing table, is used as a cut detection sensor.

FIG. 6 is a diagram illustrating an embodiment in which the film-thickness sensor 15, disposed in the polishing table 3, is used as a cut detection sensor. First, the polishing table 3 is rotated until the film-thickness sensor 15 reaches a predetermined position. This predetermined position is a position where the film-thickness sensor 15 faces the periphery of the wafer W held by the polishing head 1 when the polishing head 1 is located at the polishing position shown in FIG. 1. Next, the polishing head 1 holding the wafer W is moved to a position just above the polishing position shown in FIG. 1. At this position, the polishing head 1 and the wafer W are not in contact with the polishing pad 2. Next, while the polishing head 1 and the wafer W are rotated about the axis of the polishing head 1, the notch (or cut) 53 of the wafer W is detected by the film-thickness sensor 15 serving as a cut detection sensor. Also in this method illustrated in FIG. 6, the data processor 6 can obtain a relationship between the output signal of the film-thickness sensor 15 as a cut detection sensor and the angle of rotation of the polishing head 1, such as the one shown in FIG. 5.

After completion of the association process for associating the orientation of the wafer W with the angle of rotation of the polishing head 1, a profile-obtaining process for obtaining a film-thickness profile of the wafer W is performed. The profile-obtaining process is performed by pressing the surface (lower surface) of the wafer W against the polishing surface 2a of the polishing pad 2 at a low load by the polishing head 1 while the polishing table 3 and the polishing head 1 are rotated at different rotational speeds, and measuring the film thickness with the film-thickness sensor 15 at a plurality of measurement points on the surface of the wafer W. The center of the wafer W is preferably included among the measurement points on the surface of the wafer W.

A film-thickness profile which is obtained first is an initial film-thickness profile. In order to obtain the initial film-thickness profile, such a low load as not to allow substantial progress of polishing of the wafer W is applied to the wafer W by the polishing head 1 when pressing the surface (lower surface) of the wafer W against the polishing pad 2.

Figure 7:
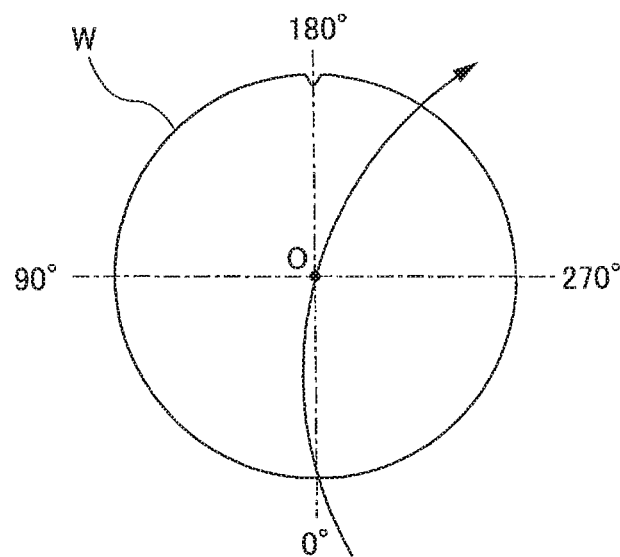
FIG. 7 is a diagram illustrating an embodiment in which the film-thickness sensor sweeps across a wafer surface only once to obtain a film-thickness profile.
Figure 8:
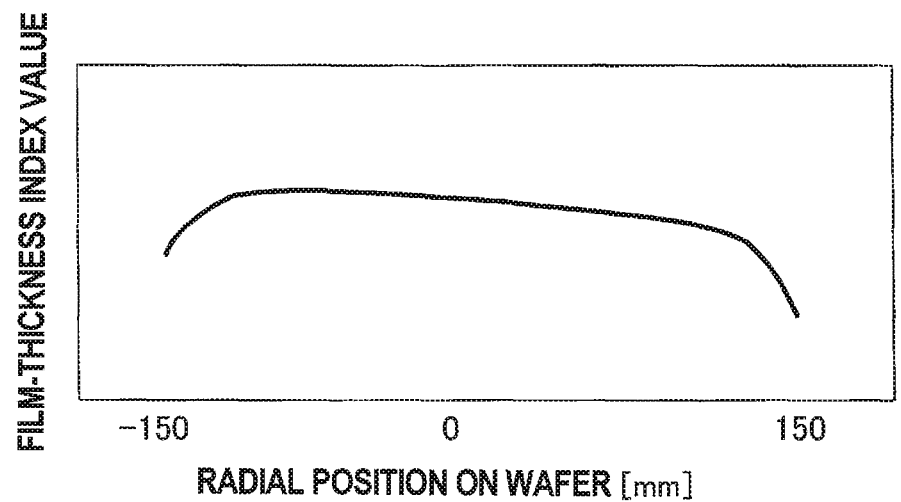
FIG. 8 is a diagram showing a film-thickness profile produced from film-thickness index values.

In one embodiment, as shown in FIG. 7, the film-thickness sensor 15 traverses the surface of the wafer W only once to obtain a film-thickness profile. The film-thickness sensor 15 measures the film thickness at a plurality of measurement points including the center of the wafer W, and sends the film-thickness index values to the data processor 6. The data processor 6 produces a film-thickness profile as shown in FIG. 8 from the film-thickness index values. This film-thickness profile indicates the relationship between film-thickness index value and radial position on the surface of the wafer W.

After the profile-obtaining process, a process of obtaining a film-thickness distribution, which indicates the relationship between the angle of rotation of the polishing head 1 and the corresponding film-thickness index value, is performed. In the embodiment illustrated in FIG. 7, a position where the film-thickness sensor 15 starts to traverse the surface of the wafer W is expressed as 0° in terms of the angle of rotation of the polishing head 1. Likewise, a position where the film-thickness sensor 15 leaves the surface of the wafer W is expressed as 225° in terms of the angle of rotation of the polishing head 1. The data processor 6 determines the relationship between the angle of rotation of the polishing head 1 and the corresponding film-thickness index value, as shown in FIG. 9. FIG. 10 is a film-thickness distribution graph showing the relationship between the angle of rotation of the polishing head 1 and the corresponding film-thickness index value. As can be seen from the film-thickness distribution shown in FIG. 10, the film-thickness index value is largest when the angle of rotation of the polishing head 1 is 0°.

In one embodiment, as shown in FIG. 11, while the polishing table 3 and the polishing head 1 are rotated at different rotational speeds, the film-thickness sensor 15 sweeps across the surface of the wafer W a plurality of times to obtain film-thickness profiles. The film-thickness sensor 15 measures the film thickness at a plurality of measurement points including the center of the wafer W, each time the polishing table 3 makes one revolution, and sends the film-thickness index values to the data processor 6. The data processor 6 produces film-thickness profiles as shown in FIG. 12 from the film-thickness index values.

In the embodiment illustrated in FIG. 11, a movement path of the film-thickness sensor 15 rotates by 45° about the center of the wafer W each time the polishing table 3 makes one revolution. Such a movement path of the film-thickness sensor 15 varies depending on a ratio between the rotational speed of the polishing head 1 and the rotational speed of the polishing table 3. FIG. 13 is a data table showing a relationship between angle of rotation of the polishing head 1 and corresponding film-thickness index value in each rotation of the polishing table 3, and FIG. 14 is a graph showing a relationship between the angle of rotation of the polishing head 1 and the corresponding film-thickness index value, shown in FIG. 13. As can be seen in FIG. 14, the film-thickness index value is largest when the angle of rotation of the polishing head 1 is 45°.

The data processor 6 produces a film-thickness distribution in the circumferential direction of the wafer W from the film-thickness profile(s) obtained in the above-described manner and, based on the film-thickness distribution, determines a first area including a portion where the film thickness of the wafer W is largest or smallest. The first area can be specified by the angle of rotation of the polishing head 1. In the example of FIG. 10, the first area where the film thickness of the wafer W is largest is located at a position where the angle of rotation of the polishing head 1 is 0°. In the example of FIG. 14, the first area where the film thickness of the wafer W is largest is located at a position where the angle of rotation of the polishing head 1 is 45°.

The operation controller 7 determines a polishing condition that can make the film thickness equal between the first area and a second area which are symmetrical with respect to the center of the wafer W. The second area is a comparative area which is determined automatically according to the position of the first area, and can be any area as long as the first area and the second area are symmetrical with respect to the center of the wafer W. The first area, on the other hand, is a target area including a portion where the film thickness of the wafer W is largest or smallest, and has a film thickness different from that of the second area.

Figure 15:
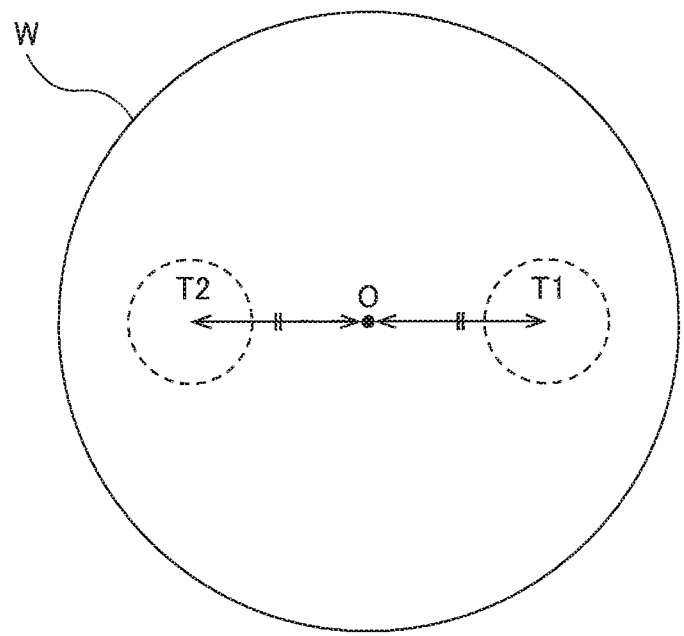
FIG. 15 is a schematic diagram showing an example of a first area and a second area of a wafer.
Figure 16:
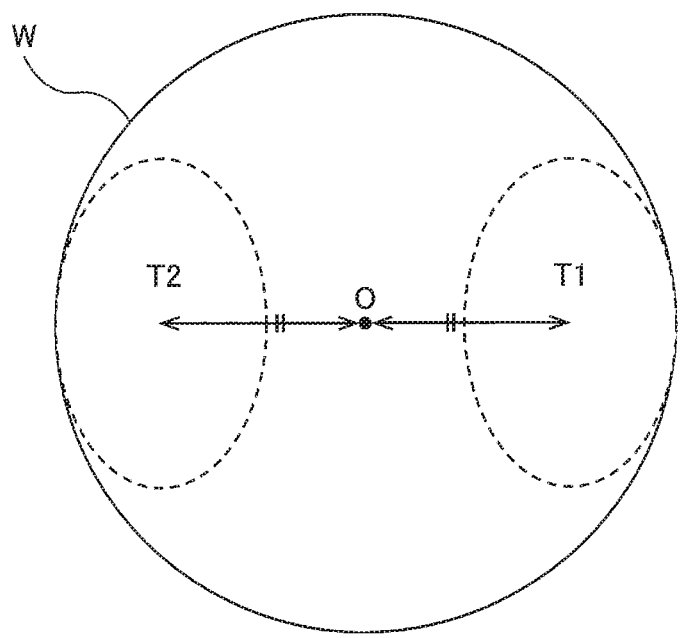
FIG. 16 is a schematic diagram showing another example of a first area and a second area of a wafer.

FIG. 15 is a schematic diagram showing an example of the first area and the second area of the wafer W, and FIG. 16 is a schematic diagram showing another example of the first area and the second area of the wafer W. As shown in FIGS. 15 and 16, a first area T1 and a second area T2 lie within the surface, to be polished, of the wafer W and are arranged along the circumferential direction of the wafer W. The first area T1 and the second area T2 are symmetrical with respect to the center O of the wafer W. Thus, a distance from the center O of the wafer W to the first area T1 is equal to a distance from the center O of the wafer W to the second area T2.

A radial position of the first area T1 on the surface of the wafer W can be determined from the film-thickness profile shown in FIG. 8 or 12, and a circumferential position of the first area T1 on the surface of the wafer W can be determined from the film-thickness distribution shown in FIG. 10 or 14.

Figure 17:
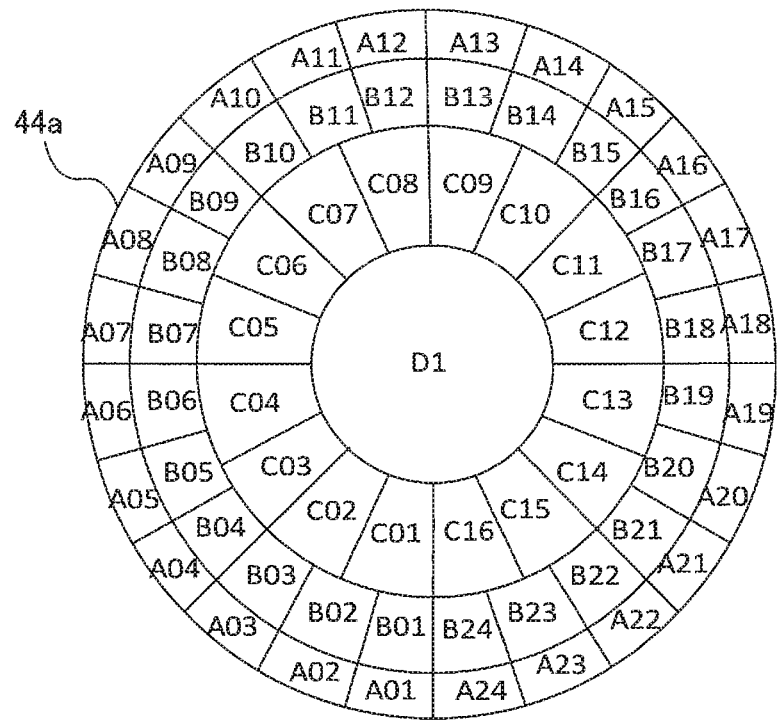
FIG. 17 is a diagram showing an example of coordinate areas pre-defined on a wafer contact surface of the polishing head.

The position of the first area T1 is represented using coordinate areas which have been pre-defined on the wafer contact surface 44a (see FIG. 3) of the polishing head 1. The coordinate areas are defined on a polar coordinate system whose origin is located on the center of the wafer contact surface 44a. FIG. 17 is a diagram showing an example of the coordinate areas pre-defined on the wafer contact surface 44a (see FIG. 3) of the polishing head 1. As shown in FIG. 17, the coordinate areas include areas arranged in the radial direction of the wafer contact surface 44a according to the positions of the four concentric pressure chambers P1, P2, P3, P4 (see FIG. 3) of the polishing head 1, and areas arranged in the circumferential direction of the wafer contact surface 44a.

Figure 18:
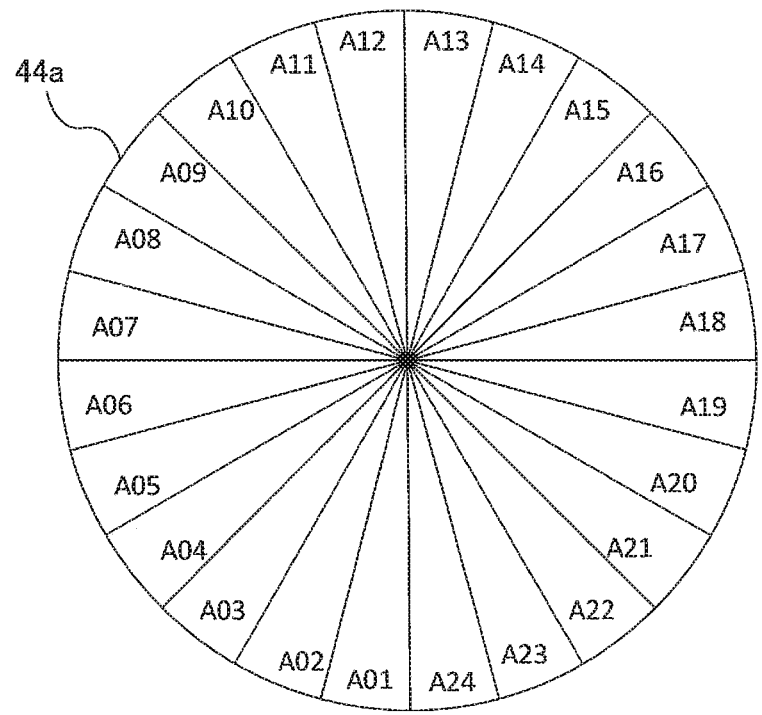
FIG. 18 is a diagram showing another example of coordinate areas pre-defined on the wafer contact surface of the polishing head.

In one embodiment, the polishing head 1 may have only one pressure chamber. In that embodiment, as shown in FIG. 18, coordinate areas pre-defined on the wafer contact surface 44a of the polishing head 1 include areas arranged in the circumferential direction of the wafer contact surface 44a, but do not include areas arranged in the radial direction of the wafer contact surface 44a.

Figure 19:
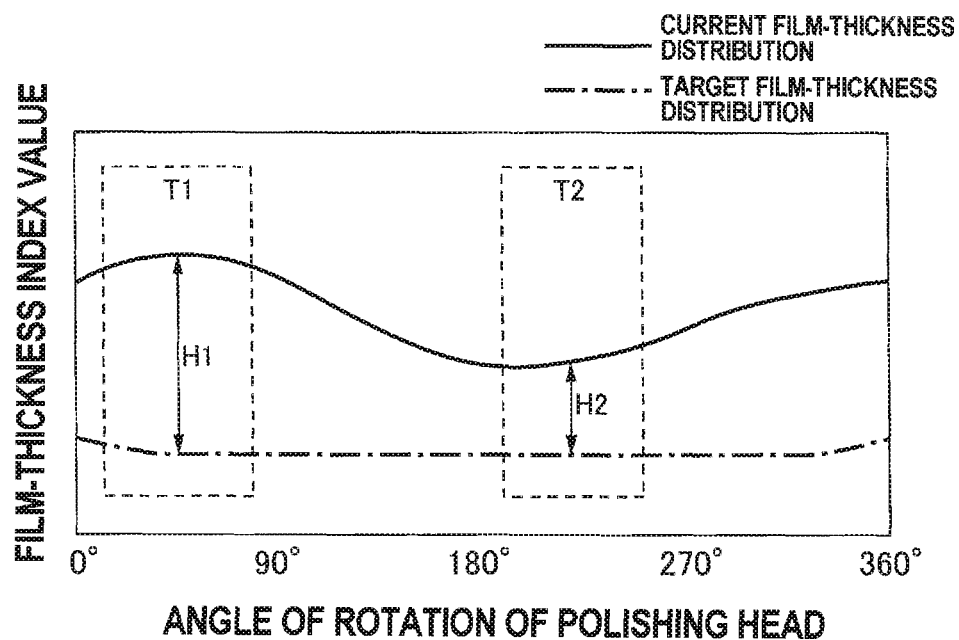
FIG. 19 is a graph showing an example of a current film-thickness distribution and a target film-thickness distribution.

The operation controller 7 specifies the position of the first area, determined by the data processor 6, with use of the coordinate area, and determines a polishing condition so that the removal rate of the first area becomes higher or lower than the removal rate of the second area. FIG. 19 is a graph showing an example of a current film-thickness distribution and a target film-thickness distribution. In this example, the first area T1 includes a portion having the maximum film thickness. Accordingly, a difference H1 between the current film-thickness distribution and the target film-thickness distribution in the first area T1 is larger than a difference H2 between the current film-thickness distribution and the target film-thickness distribution in the second area T2. The film thickness of the first area T1 and the film thickness of the second area T2 can simultaneously approach target film thickness by polishing the first area T1 at a higher removal rate than that of the second area T2. A difference between the current film-thickness distribution and the target film-thickness distribution corresponds to a target amount of polishing.

Figure 20:
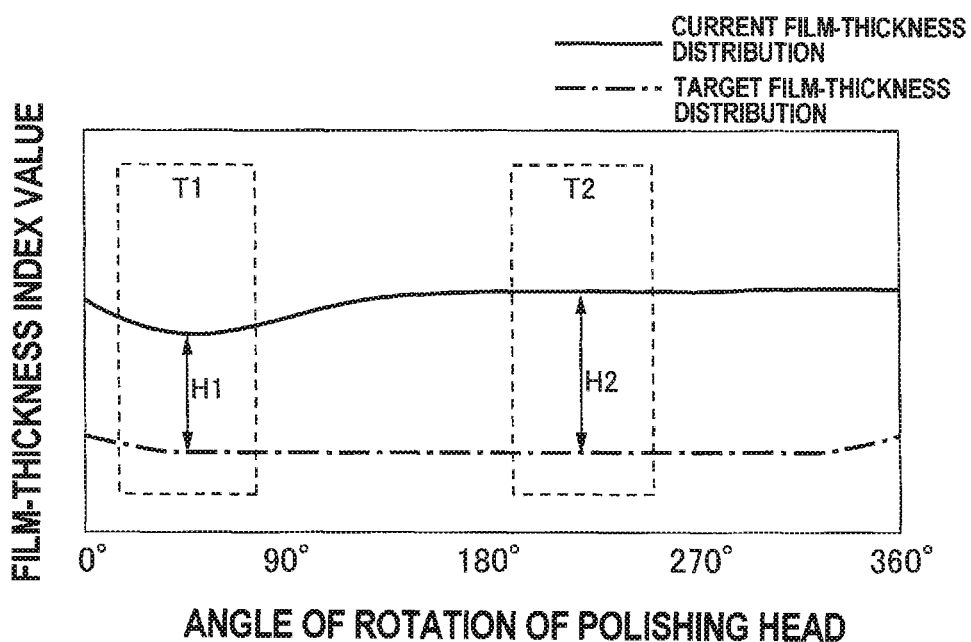
FIG. 20 is a graph showing another example of a current film-thickness distribution and a target film-thickness distribution.

FIG. 20 is a graph showing another example of a current film-thickness distribution and a target film-thickness distribution. In this example, the first area T1 includes a portion having the minimum film thickness. Accordingly, a difference H1 between the current film-thickness distribution and the target film-thickness distribution in the first area T1 is smaller than a difference H2 between the current film-thickness distribution and the target film-thickness distribution in the second area T2. The film thickness of the first area T1 and the film thickness of the second area T2 can simultaneously approach target film thickness by polishing the first area T1 at a lower removal rate than that of the second area T2.

A description will now be given of an embodiment of a polishing method which polishes the first area at a removal rate different from that of the second area. In this embodiment, while the wafer W is being rotated by the polishing head 1, the surface of the wafer W is pressed against the polishing pad 2 by the polishing head 1 which has been decentered in a direction in which a distance of the first area from the central axis of rotation of the polishing head 1 increases.

Figure 21:
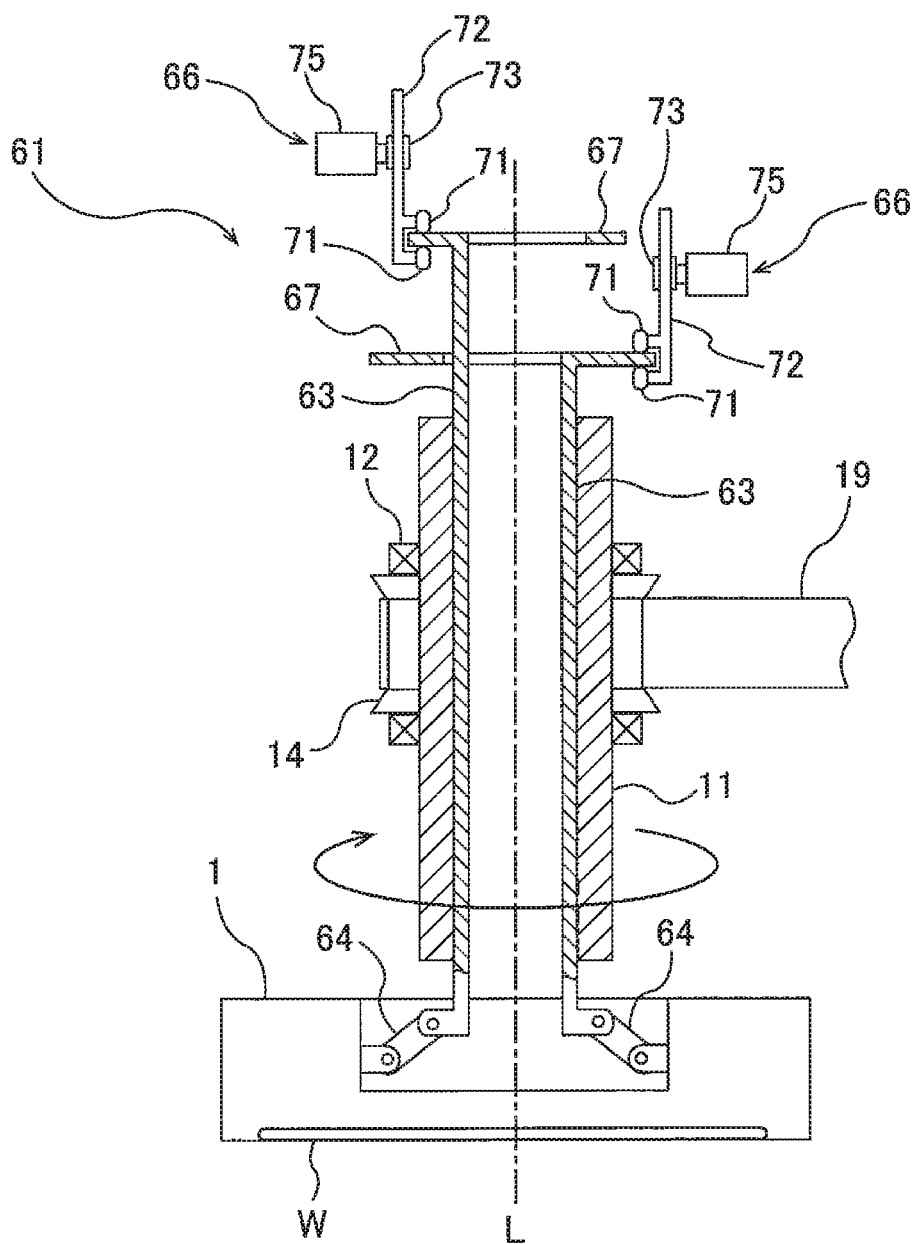
FIG. 21 is a cross-sectional view of a head-decentering mechanism which can decenter the polishing head to make it eccentric with respect to a central axis of rotation.
Figure 22:
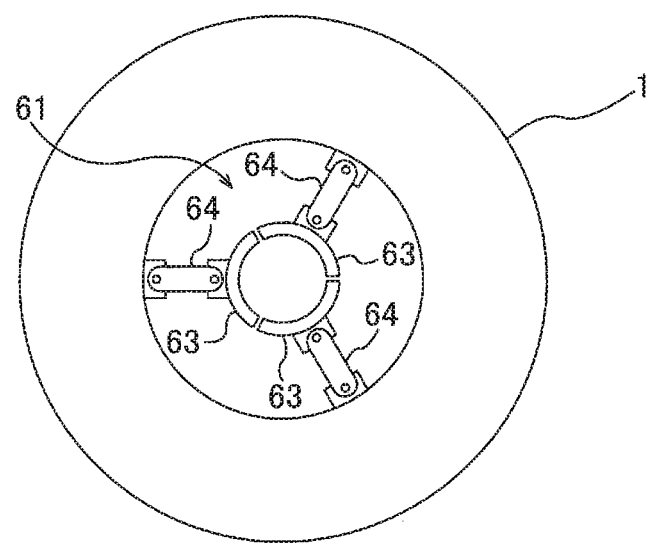
FIG. 22 is a plan view of the head-decentering mechanism shown in FIG. 21.

FIG. 21 is a cross-sectional view of a head-decentering mechanism 61 which can decenter the polishing head 1 to make it eccentric with respect to the central axis of rotation, and FIG. 22 is a plan view of the head-decentering mechanism 61 shown in FIG. 21. It is noted that the polishing head 1 is depicted schematically in FIGS. 21 and 22. The head-decentering mechanism 61 includes three rods 63, each having a generally arc-shaped horizontal cross-section, which are in engagement with an inner surface of the head shaft 11 and rotatable together with the head shaft 11. These rods 63 can slide vertically on the head shaft 11. The head-decentering mechanism 61 further includes three universal joints 64 coupling the three rods 63 to the polishing head 1, respectively, and three elevating devices 66 for elevating and lowering the three rods 63 independently of each other. Only two of the rods 63, only two of the universal joints 64, and only two of the elevating devices 66 are described in FIG. 21. A cylindrical guide member (not shown), on which the arc-shaped inner surfaces of the three rods 63 can slide, may be provided centrally within the head shaft 11.

The three rods 63 and the three universal joints 64 are arranged at equal intervals around the central axis L of rotation of the polishing head 1. An annular disk 67 is secured to the upper end of each rod 63 which extends vertically. The annular disks 67 and the central axis L of rotation of the polishing head 1 are concentric. The three rods 63 and the three annular disks 67, secured to the three rods 63, rotate together with the polishing head 1 around the central axis L of rotation of the polishing head 1, whereas the positions of the three elevating devices 66 are fixed.

Each of the elevating devices 66 includes two rollers 71 that are in rolling contact with an upper surface and a lower surface of the annular disk 67, respectively, a rack 72 holding the rollers 71, a pinion 73 that engages teeth of the rack 72, and a servo motor 75 that rotates the pinion 73. The rack 72 extends vertically. The rotation of the servo motor 75 is converted into vertical movement by the rack 72 and the pinion 73. When the servo motor 75 is set in motion, the pinion 73 rotates and the rack 72 moves vertically, so that the annular disk 67 and the rod 63 move vertically. The rollers 71 are capable of vertically moving the annular disk 67 and the rod 63 while allowing the rotation of the annular disk 67 and the rod 63.

Figure 23:
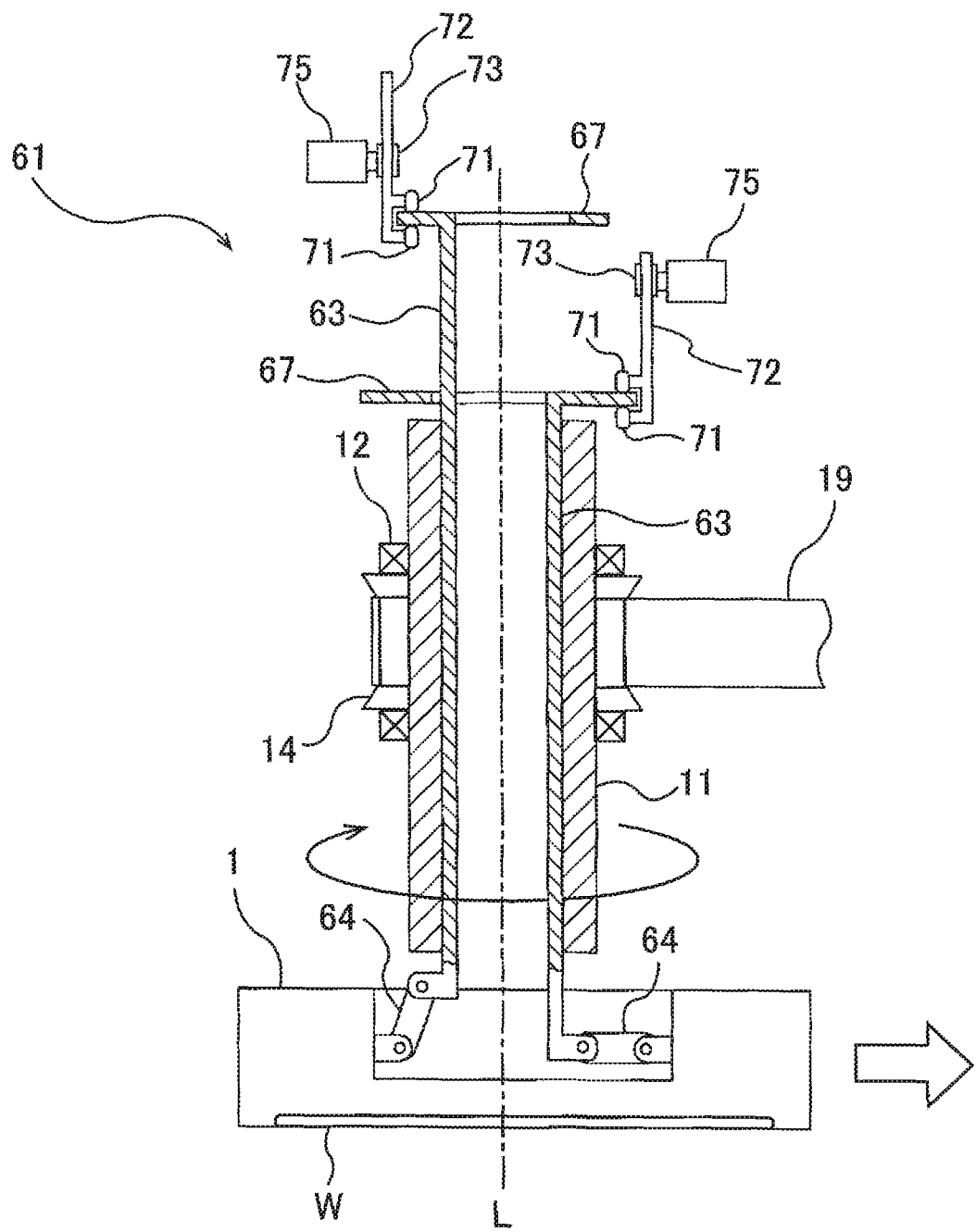
FIG. 23 is a cross-sectional view showing the polishing head in an eccentric state.
Figure 24:
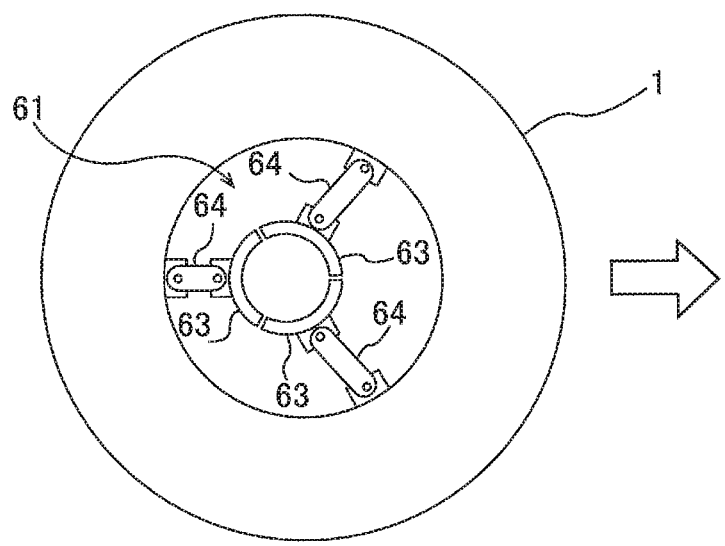
FIG. 24 is a plan view showing the polishing head in an eccentric state.

The vertical movement of each rod 63 is converted by the universal joint 64 into lateral movement of the polishing head 1. More specifically, as shown in FIGS. 23 and 24, when one or two of the three rods 63 are elevated and, at the same time, the remaining rod(s) is lowered, then the polishing head 1 is decentered to become eccentric with respect to the central axis L of rotation. The direction and the amount of the decentering of the polishing head 1 can be changed by the vertical displacements of the three rods 63.

Figure 25:
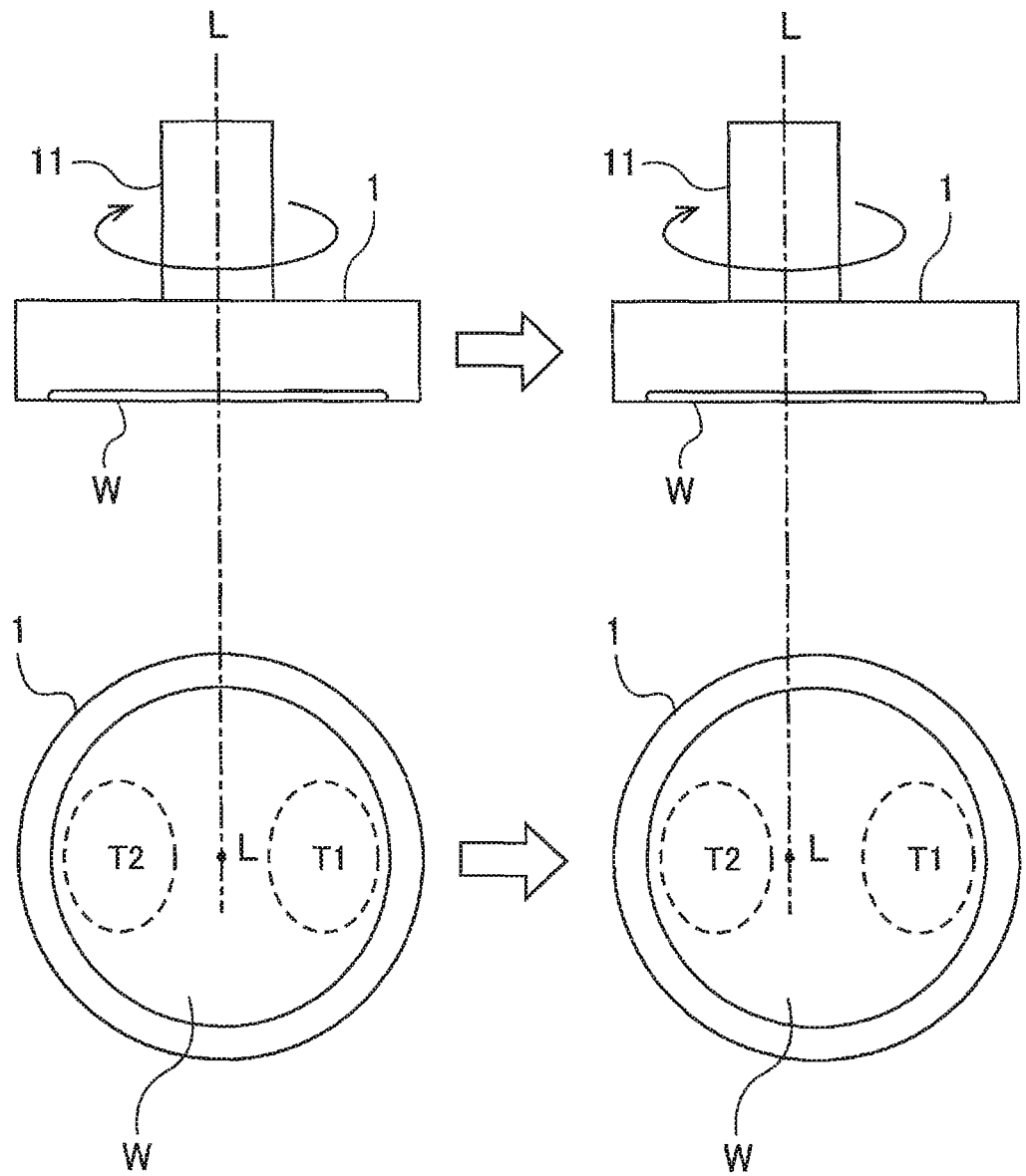
FIG. 25 is a schematic diagram illustrating decentering of the polishing head in a direction in which a distance of the first area in the wafer surface from the central axis of rotation increases.

FIG. 25 is a schematic diagram illustrating the polishing head 1 that has been decentered in a direction in which the distance of the first area T1 lying in the surface of the wafer W from the central axis L of rotation increases. As can be seen in FIG. 25, the distance of the first area T1 from the central axis L of rotation is longer than the distance of the second area T2 from the central axis L of rotation. Therefore, the first area T1 moves on the polishing surface 2a of the polishing pad 2 at a higher speed than the second area T2. Accordingly, the first area T1 is polished at a higher removal rate than that of the second area T2.

When the wafer W has the film-thickness distribution shown in FIG. 20, the film thickness of the first area T1 and the film thickness of the second area T2 can simultaneously approach target film thickness by polishing the first area T1 at a lower removal rate than that of the second area T2. In this case, therefore, while the wafer W are being rotated by the polishing head 1, the surface of the wafer W is pressed against the polishing pad 2 by the polishing head 1 which has been decentered in a direction in which the distance of the first area T1 from the central axis L of rotation of the polishing head 1 decreases. Since the distance of the first area T1 from the central axis L of rotation is shorter than the distance of the second area T2 from the central axis L of rotation, the first area T1 is polished at a lower removal rate than that of the second area T2.

A description will now be given of another embodiment of a polishing method which polishes the first area T1 at a removal rate different from that of the second area T2. In this embodiment, a load applied by the polishing head 1 to the entirety of the surface, including the first area T1 and the second area T2, of the wafer W is increased when the first area T1 is located outwardly of the second area T2 in the radial direction of the polishing table 3.

Figure 26:
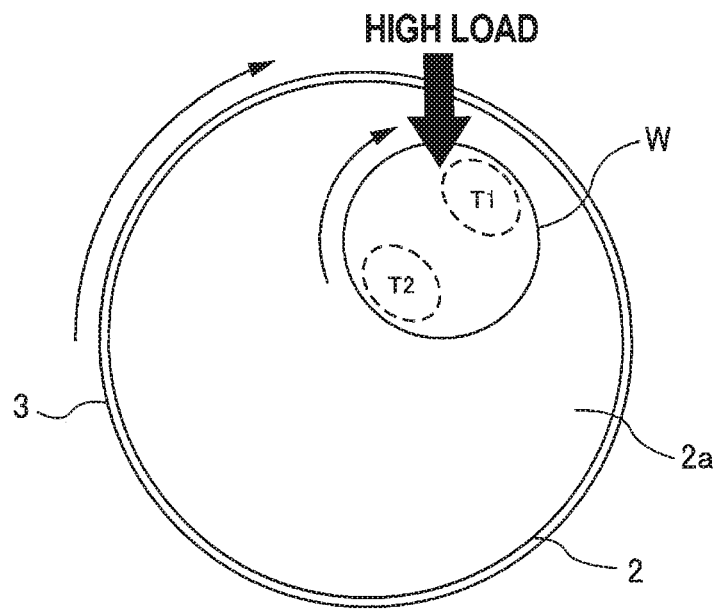
FIG. 26 is a schematic diagram illustrating a wafer being pressed against a polishing surface of a polishing pad on the polishing table.
Figure 26:
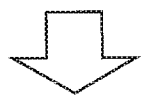
Figure 26:
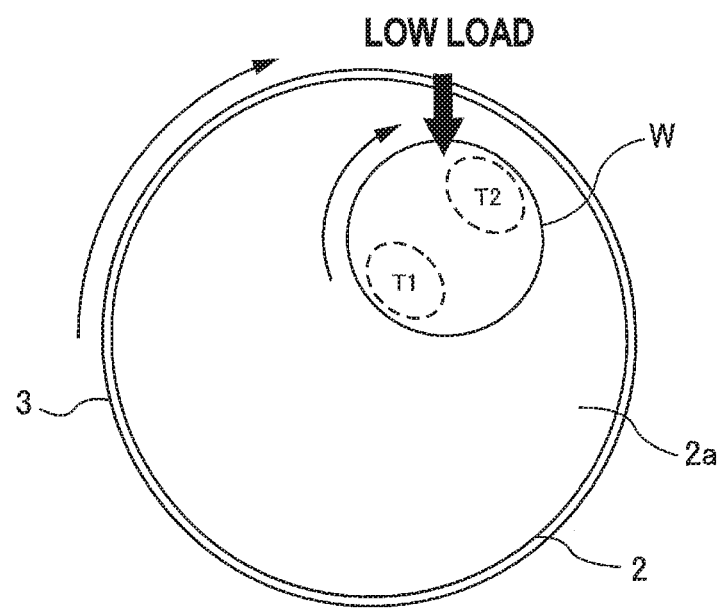

FIG. 26 is a schematic diagram illustrating the wafer W being pressed against the polishing surface 2a of the polishing pad 2 on the polishing table 3. The polishing table 3 and the wafer W rotate in the same direction. The larger a distance of an area in the surface of the wafer W from the center of the polishing table 3, the higher the relative speed between that area and the polishing surface 2a of the polishing pad 2. The first area T1 and the second area T2, which are symmetrical with respect to the center of the wafer W, alternately move closer to and away from the center of the polishing table 3.

As illustrated in FIG. 26, when the first area T1 is located outwardly of the second area T2 in the radial direction of the polishing table 3, the load applied by the polishing head 1 to the entire surface of the wafer W is increased. More specifically, the pressures in the pressure chambers P1, P2, P3, P4 (see FIG. 3) of the polishing head 1 are increased when the first area T1 is located radially outwardly of the second area T2, whereas the pressures in the pressure chambers P1, P2, P3, P4 of the polishing head 1 are decreased when the first area T1 is located inwardly of the second area T2. By thus periodically increasing the load on the entire surface of the wafer W according to the rotation of the wafer W, the removal rate of the particular first area T1 can be increased. Accordingly, the polishing head 1 can polish the first area T1 at a higher removal rate than that of the second area T2.

When the wafer W has the film-thickness distribution shown in FIG. 20, the film thickness of the first area T1 and the film thickness of the second area T2 can simultaneously approach target film thickness by polishing the first area T1 at a lower removal rate than that of the second area T2. In this case, therefore, when the first area T1 is located outwardly of the second area T2 in the radial direction of the polishing table 3, the load applied by the polishing head 1 to the entire surface of the wafer W is decreased. Such an operation enables the polishing head 1 to polish the first area T1 at a lower removal rate than that of the second area T2.

A description will now be given of another embodiment of a polishing method which polishes the first area T1 at a removal rate different from that of the second area T2. In this embodiment, a local load applied from the polishing head 1 to the first area T1 is increased when the first area T1 is located outwardly of the second area T2 in the radial direction of the polishing table 3.

Figure 27:
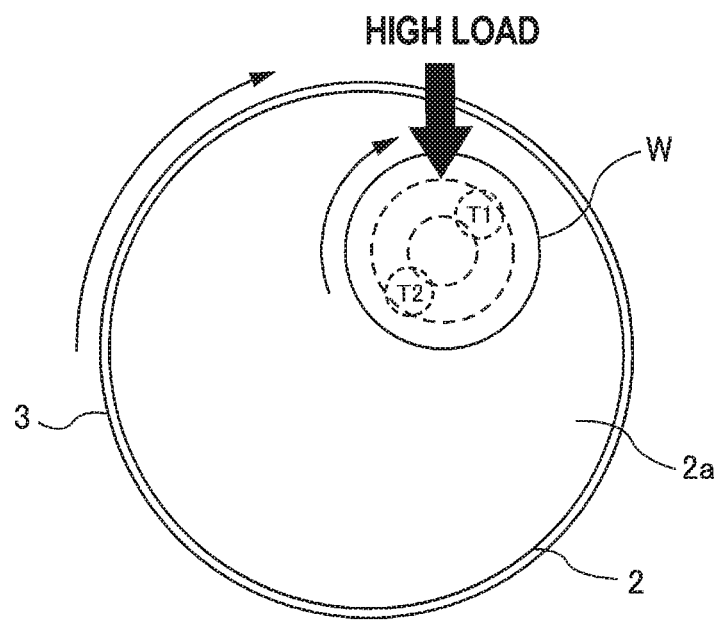
FIG. 27 is a schematic diagram illustrating a wafer being pressed against a polishing surface of a polishing pad on the polishing table.
Figure 27:
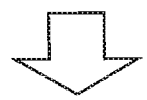
Figure 27:
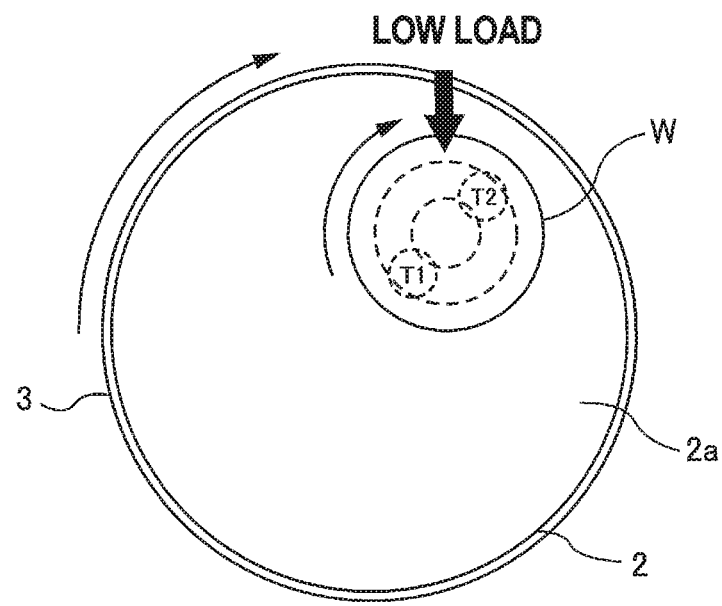

FIG. 27 is a schematic diagram illustrating the wafer W being pressed against the polishing surface 2a of the polishing pad 2 on the polishing table 3. The polishing table 3 and the wafer W rotate in the same direction. The larger a distance of an area in the surface of the wafer W from the center of the polishing table 3, the higher the relative speed between that area and the polishing surface 2a of the polishing pad 2. The first area T1 and the second area T2, which are symmetrical with respect to the center of the wafer W, alternately move closer to and away from the center of the polishing table 3.

As illustrated in FIG. 27, when the first area T1 is located outwardly of the second area T2 in the radial direction of the polishing table 3, a local load applied from the polishing head 1 to the first area T1 of the wafer W is increased. More specifically, the pressure in one or more of the pressure chambers P1, P2, P3, P4 (see FIG. 3) of the polishing head 1, located at a position corresponding to the position of the first area T1, is increased when the first area T1 is located outwardly of the second area T2, whereas the pressure in the one or more of the pressure chambers P1, P2, P3, P4 of the polishing head 1, located at a position corresponding to the position of the first area T1, is decreased when the first area T1 is located inwardly of the second area T2. By thus periodically increasing the local load on the first area T1 according to the rotation of the wafer W, the removal rate of the particular first area T1 can be increased. Accordingly, the polishing head 1 can polish the first area T1 at a higher removal rate than that of the second area T2.

When the wafer W has the film-thickness distribution shown in FIG. 20, the film thickness of the first area T1 and the film thickness of the second area T2 can simultaneously approach target film thickness by polishing the first area T1 at a lower removal rate than that of the second area T2. In this case, therefore, when the first area T1 is located outwardly of the second area T2 in the radial direction of the polishing table 3, the local load applied by the polishing head 1 to the first area T1 of the wafer W is decreased. Such an operation enables the polishing head 1 to polish the first area T1 at a lower removal rate than that of the second area T2.

A description will now be given of another embodiment of a polishing method which polishes the first area T1 at a removal rate different from that of the second area T2. In this embodiment, the polishing head 1, together with the wafer W, is moved outwardly in the radial direction of the polishing table 3 when the first area T1 is located outwardly of the second area T2 in the radial direction of the polishing table 3.

Figure 28:
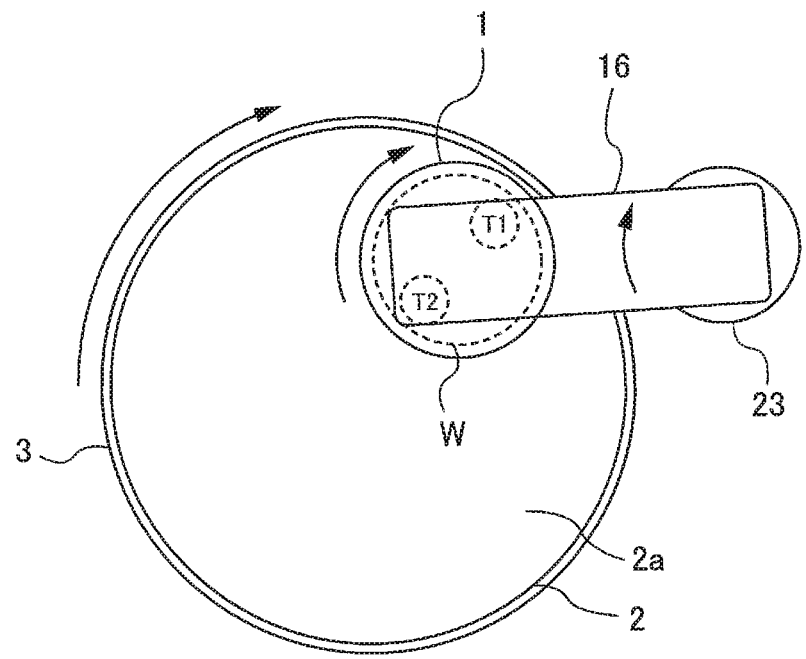
FIG. 28 is a schematic diagram illustrating a wafer being pressed against a polishing surface of a polishing pad on the polishing table.
Figure 28:
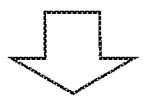
Figure 28:
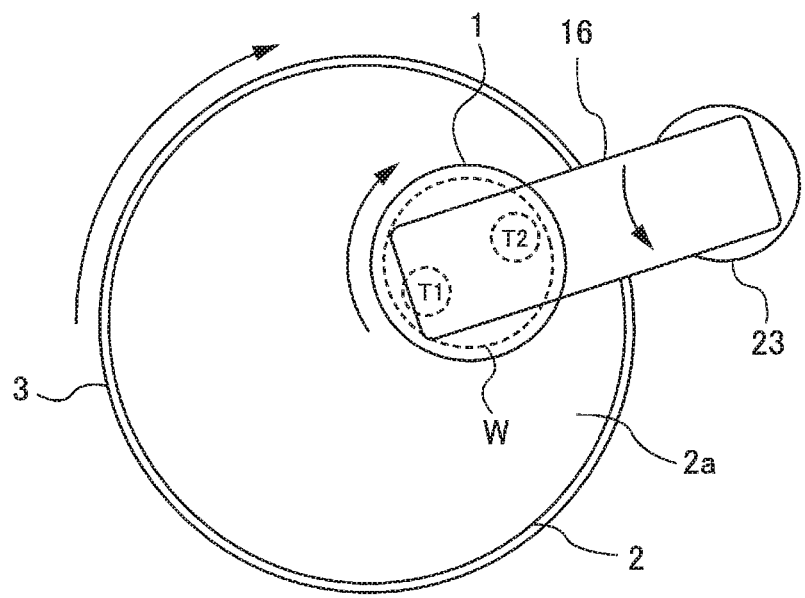

FIG. 28 is a schematic diagram illustrating the wafer W being pressed against the polishing surface 2a of the polishing pad 2 on the polishing table 3. The polishing table 3 and the wafer W rotate in the same direction. The larger a distance of an area of the surface of the wafer W from the center of the polishing table 3, the higher the relative speed between that area and the polishing surface 2a of the polishing pad 2.

As illustrated in FIG. 28, when the first area T1 is located outwardly of the second area T2 in the radial direction of the polishing table 3, the polishing head 1, together with the wafer W, is moved outwardly in the radial direction of the polishing table 3. More specifically, the head pivoting motor 23 is driven to move the polishing head 1 and the head arm 16 radially outwardly when the first area T1 is located outwardly of the second area T2, whereas the head pivoting motor 23 is driven to move the polishing head 1 and the head arm 16 radially inwardly when the first area T1 is located inwardly of the second area T2. By thus periodically oscillating the polishing head 1 and the wafer W according to the rotation of the wafer W, the removal rate of the particular first area T1 can be increased. Accordingly, the polishing head 1 can polish the first area T1 at a higher removal rate than that of the second area T2.

When the wafer W has the film-thickness distribution shown in FIG. 20, the film thickness of the first area T1 and the film thickness of the second area T2 can simultaneously approach target film thickness by polishing the first area T1 at a lower removal rate than that of the second area T2. In this case, therefore, when the first area T1 is located outwardly of the second area T2 in the radial direction of the polishing table 3, the polishing head 1, together with the wafer W, is moved inwardly in the radial direction of the polishing table 3. Such an operation enables the polishing head 1 to polish the first area T1 at a lower removal rate than that of the second area T2.

Figure 29:
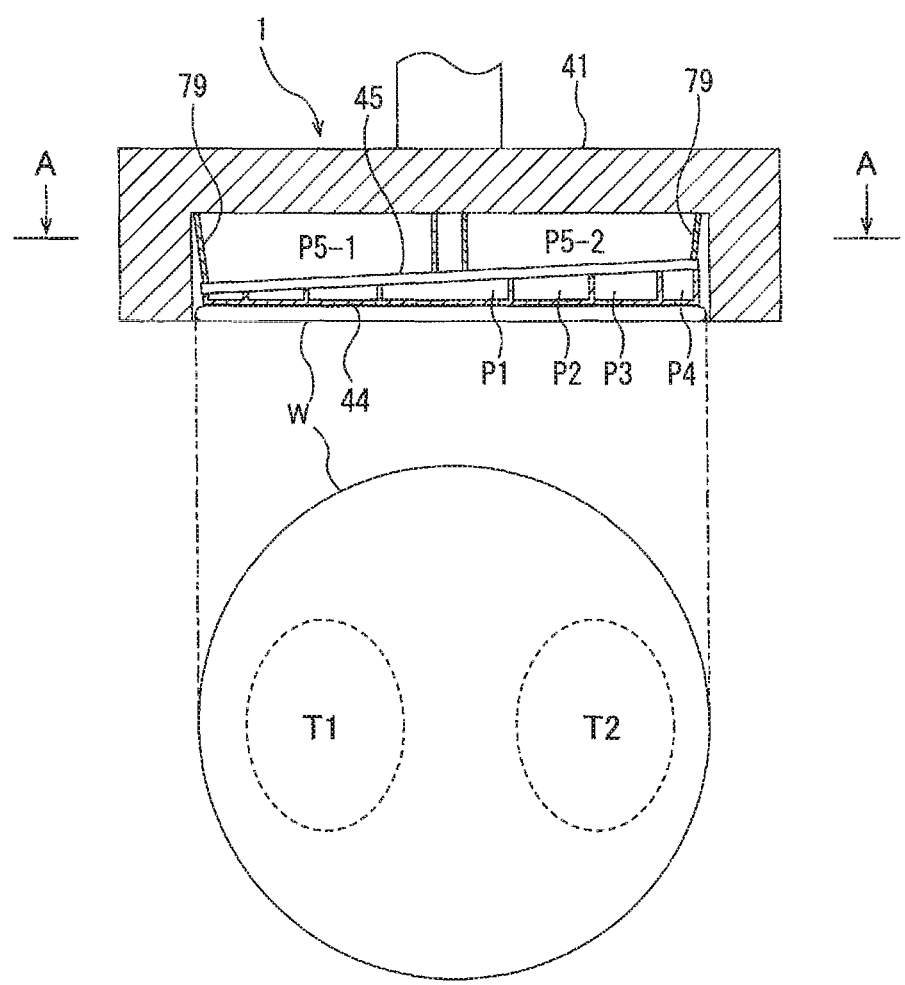
FIG. 29 is a cross-sectional view of a polishing head for use in an embodiment of a polishing method which polishes a first area at a removal rate different from that of a second area of a wafer.
Figure 30:
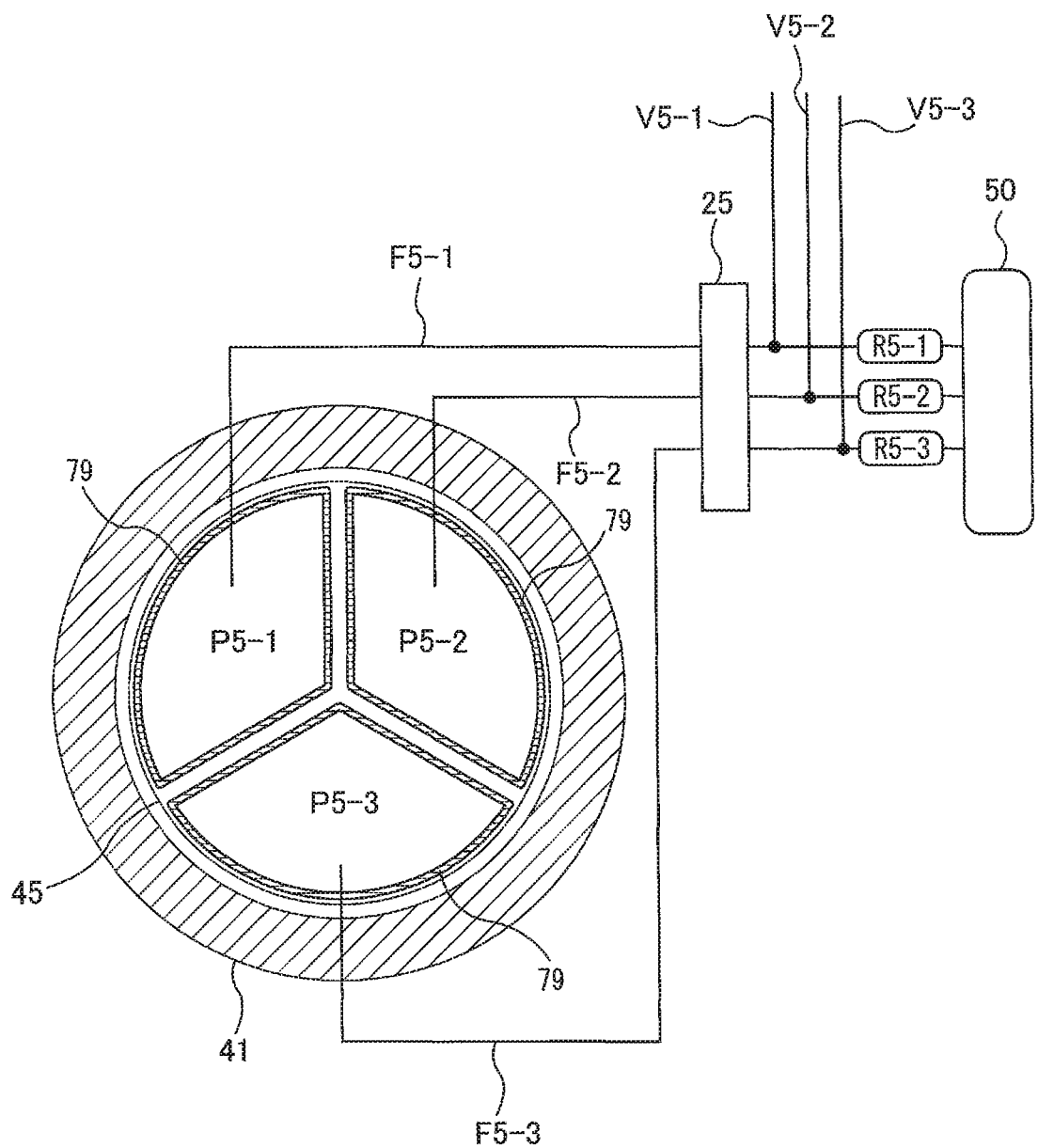
FIG. 30 is a cross-sectional view taken along a line A-A of FIG. 29.

A description will now be given of another embodiment of a polishing method which polishes the first area T1 at a removal rate different from that of the second area T2. FIG. 29 is a cross-sectional view of a polishing head 1 for use in this embodiment, and FIG. 30 is a cross-sectional view taken along a line A-A of FIG. 29. It is noted that the polishing head 1 is depicted schematically in FIGS. 29 and 30. The detailed construction of the polishing head 1 is the same as that shown in FIG. 3.

In this embodiment, while the wafer W is being rotated by the polishing head 1, the surface of the wafer W is pressed against the polishing pad 2 by the elastic membrane 44 of the polishing head 1, with the membrane holder 45, holding the elastic membrane 44, being in an inclined state. The membrane holder 45 is inclined upwardly in a direction from the first area T1 toward the second area T2.

Three partition membranes 79 are disposed between the head body 41 and the membrane holder 45. Upper ends of the partition membranes 79 are connected to an inner surface of the head body 41, and lower ends of the partition membranes 79 are connected to an upper surface of the membrane holder 45. Three actuating chambers P5-1, P5-2, P5-3 are formed by the partition membranes 79, the head body 41, and the membrane holder 45. The three partition membranes 79 are arranged at equal intervals around the axis of the polishing head 1. Accordingly, the three actuating chambers P5-1, P5-2, P5-3 are also arranged at equal intervals around the axis of the polishing head 1. It is also possible to provide four or more partition membranes and four or more actuating chambers.

Gas delivery lines F5-1, F5-2, F5-3, communicating with the actuating chambers P5-1, P5-2, P5-3, are provided with pressure regulators R5-1, R5-2, R5-3, respectively. A pressurized gas from the gas supply source 50 passes through the pressure regulators R5-1, R5-2, R5-3, and is supplied into the actuating chambers P5-1, P5-2, P5-3. The pressure regulators R5-1, R5-2, R5-3 are coupled to the actuating chambers P5-1, P5-2, P5-3 by the gas delivery lines F5-1, F5-2, F5-3. The gas delivery lines F5-1, F5-2, F5-3 extend from the actuating chambers P5-1, P5-2, P5-3 to the gas supply source 50 via the rotary joint 25 and the pressure regulators R5-1, R5-2, R5-3.

The pressure regulators R5-1, R5-2, R5-3 regulate the pressure of the pressurized gas supplied from the gas supply source 50, thereby controlling the pressures in the actuating chambers P5-1, P5-2, P5-3. The pressure regulators R5-1, R5-2, R5-3 are coupled to the operation controller 7 shown in FIG. 1, and are controlled by the operation controller 7. The actuating chambers P5-1, P5-2, P5-3 are also coupled to vent valves (not shown) so that the actuating chambers P5-1, P5-2, P5-3 can be opened to the atmosphere. Vacuum lines V5-1, V5-2, V5-3 are coupled to the gas delivery lines F5-1, F5-2, F5-3, respectively, so that a negative pressure is created in each of the actuating chambers P5-1, P5-2, P5-3 by the vacuum lines V5-1, V5-2, V5-3.

The pressure regulators R5-1, R5-2, R5-3 can change the pressures in the actuating chambers P5-1, P5-2, P5-3 independently of each other. By changing the pressure balance between the actuating chambers P5-1, P5-2, P5-3, the membrane holder 45 can be inclined in a desired direction.

As shown in FIG. 29, the membrane holder 45 is inclined upwardly in a direction from the first area T1 toward the second area T2. The elastic membrane 44 is contracted around the first area T1, while the elastic membrane 44 expands around the second area T2. When the membrane holder 45 is in such an inclined state, the elastic membrane 44 can expand more in its portion around the first area T1 than in its portion around the second area T2. Therefore, the polishing head 1 can press the first area T1 at a higher load than a load on the second area T2. Accordingly, the first area T1 can be polished at a higher removal rate than that of the second area T2.

When the wafer W has the film-thickness distribution shown in FIG. 20, the film thickness of the first area T1 and the film thickness of the second area T2 can simultaneously approach target film thickness by polishing the first area T1 at a lower removal rate than that of the second area T2. In this case, therefore, the membrane holder 45 is inclined downwardly in a direction from the first area T1 toward the second area T2 by changing the pressure balance between the actuating chambers P5-1, P5-2, P5-3. Such an operation enables the polishing head 1 to polish the first area T1 at a lower removal rate than that of the second area T2.

The film-thickness distribution of the wafer W changes with the progress of polishing of the wafer W, and the position of the first area T1 can change accordingly. Therefore, the data processor 6 may update the film-thickness distribution during polishing of the wafer W, while the operation controller 7 may optimize a polishing condition based on the updated film-thickness distribution. For example, during polishing of the wafer W, the data processor 6 obtains and updates the film-thickness distribution each time the polishing table 3 rotates a predetermined number of times (e.g. five times), and the operation controller 7 optimizes a polishing condition based on the updated film-thickness distribution. The film-thickness distribution of the wafer W during polishing is obtained by the process illustrated in FIGS. 7 through 10 or the process illustrated in FIGS. 11 through 14.

In one embodiment, during polishing of the wafer W, the operation controller 7 optimizes a polishing condition each time the film-thickness distribution is updated, and operates the polishing-condition adjusting system 8 according to the optimized polishing condition, and the wafer W is polished under the optimized polishing condition. The polishing-condition adjusting system 8 is composed of the pressure regulators R1 to R4, the head pivoting motor 23, the head-decentering mechanism 61, the pressure regulators R5-1, R5-2, R5-3, etc.

According to the above-described embodiments, the first area T1 is polished at a removal rate different from that of the second area T2 based on a difference in film thickness between these two areas. This operation makes it possible to equalize the film thickness between the first area T1 and the second area T2 which are symmetrical with respect to the center of the wafer, thereby eliminating the variation in the film thickness along the circumferential direction of the wafer.

Figure 31:
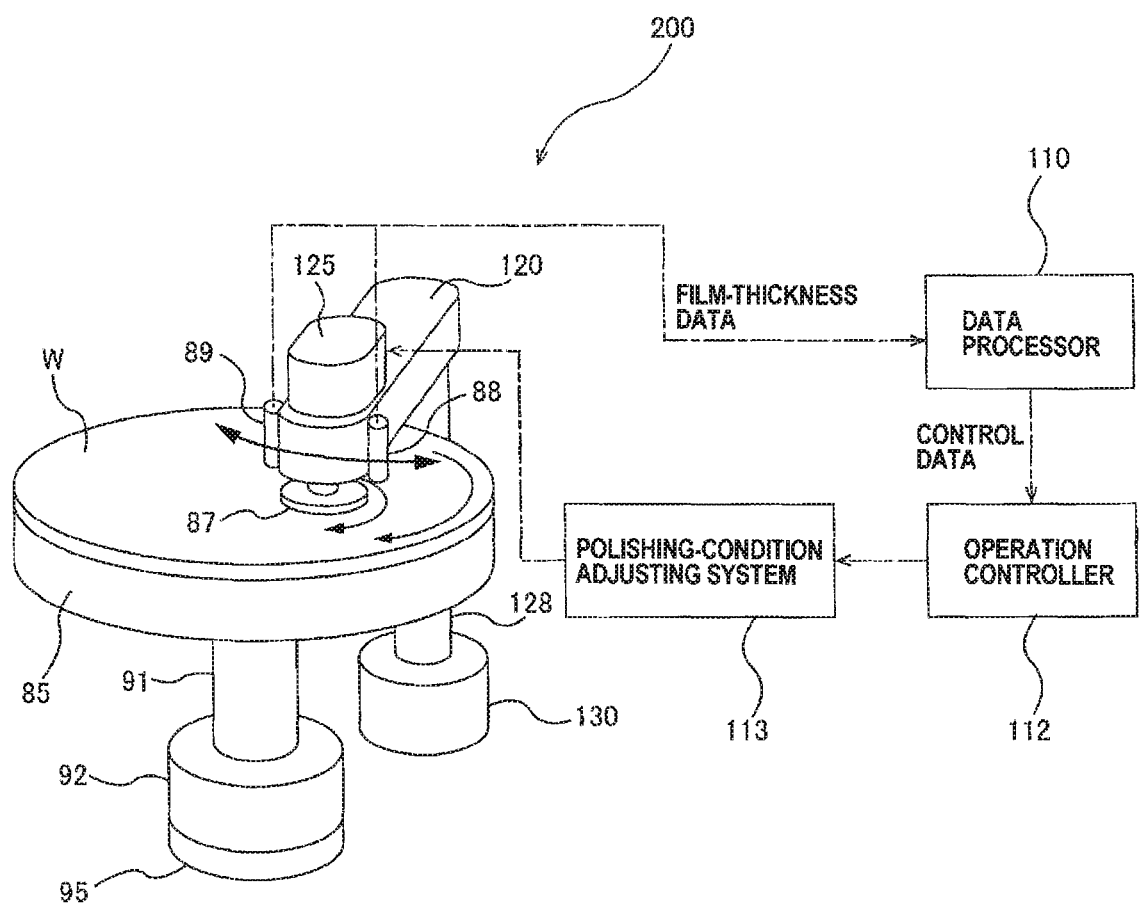
FIG. 31 is a perspective view of an embodiment of a buffing apparatus usable for finish-polishing of an entirety of a surface of a substrate, such as a wafer.

Another embodiment of a polishing apparatus which can perform a polishing method according to the present invention will now be described. FIG. 31 is a perspective view of an embodiment of a buffing apparatus usable in finish-polishing of an entire surface of a substrate, such as a wafer. For example, after chemical-mechanical polishing as a first-stage polishing process is performed with the above-described CMP apparatus 100, finish-polishing as a second-stage polishing process is performed with a buffing apparatus 200.

The buffing apparatus 200 includes a wafer stage (or substrate stage) 85 for holding a wafer W, a polishing disk 87 for polishing the wafer W on the wafer stage 85, and two film-thickness sensors 88, 89 for measuring a film thickness of the wafer W. The wafer W, with its to-be-polished surface facing upward, is placed on the wafer stage 85. The wafer stage 85 is configured to be capable of holding, by vacuum suction, the wafer W on an upper surface thereof. The wafer stage 85 is coupled via a stage shaft 91 to a stage motor 92. The wafer stage 85 and the wafer W, held on it, are rotated about the axis of the wafer W by the stage motor 92.

A rotary encoder 95, which is a rotational angle detector, is mounted to the stage motor 92. The rotary encoder 95 is configured to detect an angle of rotation of the wafer stage 85 coupled to the stage motor 92. The rotary encoder 95 is coupled to a data processor 110, and the angle of rotation of the wafer stage 85, detected by the rotary encoder 95, is transmitted to the data processor 110.

Figure 32:
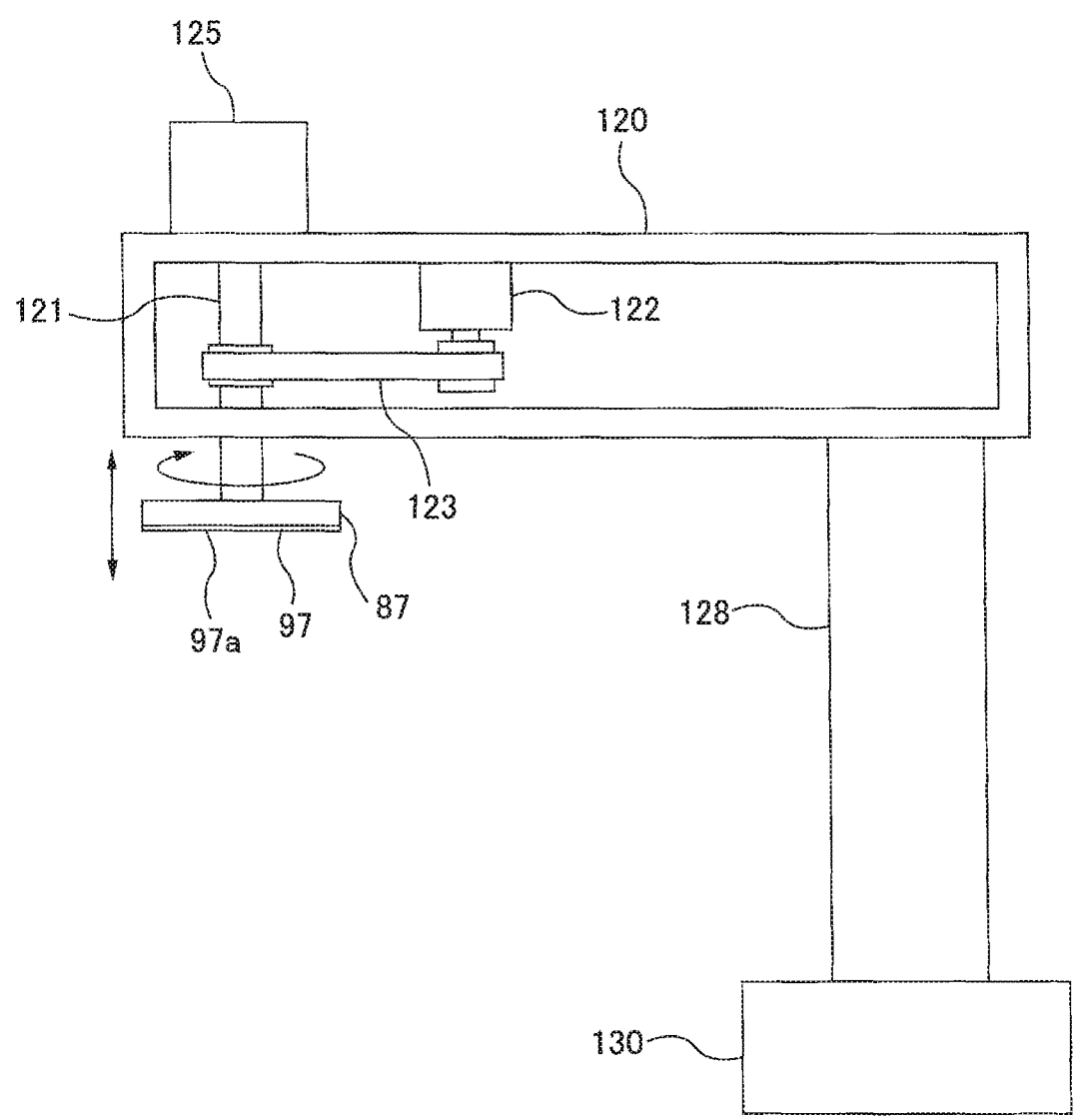
FIG. 32 is a diagram showing a polishing disk and a disk arm which are shown in FIG. 31.

The polishing disk 87 is rotatably supported by a disk arm 120. FIG. 32 is a diagram showing the polishing disk 87 and the disk arm 120. The polishing disk 87 is secured to a lower end of a disk shaft 121, which is rotatably supported by the disk arm 120. A disk motor 122 for rotating the polishing disk 87 about its axis is disposed in the disk arm 120. The disk motor 122 is coupled to the disk shaft 121 via a torque transmitting mechanism 123 comprised of pulleys and a belt.

The polishing disk 87 has a polishing cloth 97 whose lower surface constitutes a polishing surface 97a for buffing the wafer W. The disk arm 120 is provided with a disk pressing device 125 coupled via the disk shaft 121 to the polishing disk 87. The disk pressing device 125 is comprised of, for example, an air cylinder, and configured to be capable of pressing the polishing surface 97a of the polishing disk 87 against the upper surface, i.e. the surface to be polished, of the wafer W.

The disk arm 120 is configured to be capable of pivoting on a disk arm shaft 128, which is coupled to a disk pivoting motor 130. The disk pivoting motor 130 is configured to be capable of rotating the disk arm shaft 128 clockwise and counterclockwise through a predetermined angle. When the disk pivoting motor 130 is set in motion, the polishing disk 87 and the disk arm 120 pivot around the disk arm shaft 128.

Referring back to FIG. 31, the two film-thickness sensors 88, 89 are comprised of a first film-thickness sensor 88 and a second film-thickness sensor 89 which have the same construction. The first film-thickness sensor 88 and the second film-thickness sensor 89 are mounted to a distal end of the disk arm 120 and located at both sides of the polishing disk 87. The film-thickness sensors 88, 89 are located above the wafer W held on the wafer stage 85, and measure the film thickness of the wafer W from above the wafer W. The first film-thickness sensor 88 and the second film-thickness sensor 89 are disposed along the direction of movement of the polishing disk 87. The film-thickness sensors 88, 89 may be each an eddy-current sensor or an optical sensor, and are configured to produce film-thickness index values that vary in accordance with the film thickness of the wafer W. A film-thickness index value is a value which directly or indirectly indicates the film thickness. The first film-thickness sensor 88 and the second film-thickness sensor 89 are arranged to move together with the polishing disk 87. Each time the polishing disk 87 moves from one end of the wafer W to an opposite end, the first film-thickness sensor 88 and the second film-thickness sensor 89 alternately measure the film thickness at a plurality of measurement points, including the center of the wafer W, and output the above-described film-thickness index values.

The first film-thickness sensor 88 and the second film-thickness sensor 89 are coupled to the data processor 110. The film-thickness index values, obtained at the measurement points on the surface of the wafer W, are sent as film-thickness data to the data processor 110. The data processor 110 produces a film-thickness profile from the film-thickness data, and further produces a film-thickness distribution from the film-thickness profile(s). As described above, the film-thickness profile indicates the relationship between film-thickness index value (i.e. film thickness) and radial position on the wafer W, and the film-thickness distribution indicates the distribution of the film-thickness index values (i.e. the distribution of film thicknesses) in the circumferential direction of the wafer W.

The data processor 110 is coupled to an operation controller 112. The operation controller 112 is configured to determine a polishing condition based on the film-thickness distribution. More specifically, the operation controller 112 is configured to determine a polishing condition that can bring a current film-thickness distribution closer to a target film-thickness distribution. The operation controller 112 is coupled to a polishing-condition adjusting system 113, which is composed of the disk pressing device 125, the disk motor 122, etc.

Polishing of the wafer W is performed in the following manner. The wafer W, with its to-be-polished surface facing upward, is held on the wafer stage (substrate stage) 85. The stage motor 92 rotates the wafer stage 85 and the wafer W, while the disk motor 122 rotates the polishing disk 87. The polishing disk 87 is lowered by the disk pressing device 125, and the polishing surface 97a of the polishing disk 87 is brought into contact with the surface (upper surface) of the wafer W. While keeping the polishing disk 87 in contact with the surface of the wafer W, the polishing disk 87 oscillates on the surface of the wafer W between one end and the opposite end of the wafer W a plurality of times. The polishing disk 87 rubs against the surface of the wafer W, thereby polishing the surface of the wafer W.

In this embodiment, the buffing apparatus 200, which is used as a finish-polishing apparatus, eliminates a variation in the film thickness along the circumferential direction of the wafer W in the following manner. At the outset, an association process for associating the orientation of the wafer W with the angle of rotation of the wafer stage 85 is performed prior to polishing of the wafer W. The association process is carried out by using the first film-thickness sensor 88 that functions as a cut detection sensor for detecting a notch (or cut) formed in the periphery of the wafer W.

Figure 33:
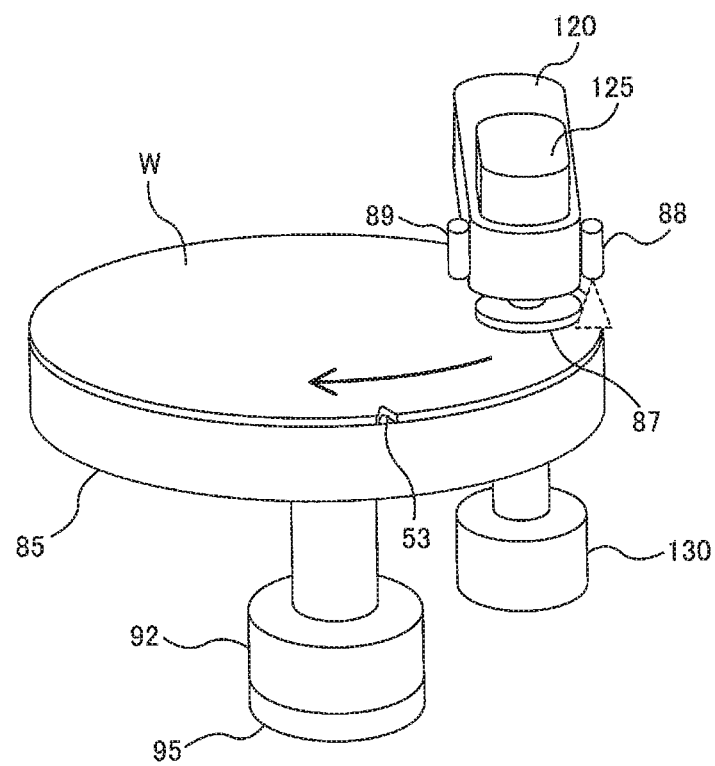
FIG. 33 is a diagram illustrating a process of detecting a notch (or a cut) formed in a periphery of a wafer.

FIG. 33 is a diagram illustrating a process for detecting a notch (or cut) formed in the periphery of the wafer W. The polishing disk 87 is moved by the disk pivoting motor 130 until the first film-thickness sensor 88 reaches a position above the periphery of the wafer W on the wafer stage 85. At this position, the polishing disk 87 is not in contact with the wafer W. Next, while the wafer stage 85 and the wafer W are being rotated about the axis of the wafer stage 85 by the stage motor 92, a notch (cut) 53 of the wafer W is detected by the first film-thickness sensor 88 that functions as a cut detection sensor. During the detection process of the notch 53, the polishing disk 87 is kept out of contact with the wafer W. The angle of rotation of the wafer stage 85 (i.e. the angle of rotation of the wafer W) is measured by the rotary encoder 95 mounted to the stage motor 92. The measured value of the angle of rotation of the wafer stage 85 is transmitted to the data processor 110. The output signal of the first film-thickness sensor 88 is transmitted to the data processor 110.

Figure 34:
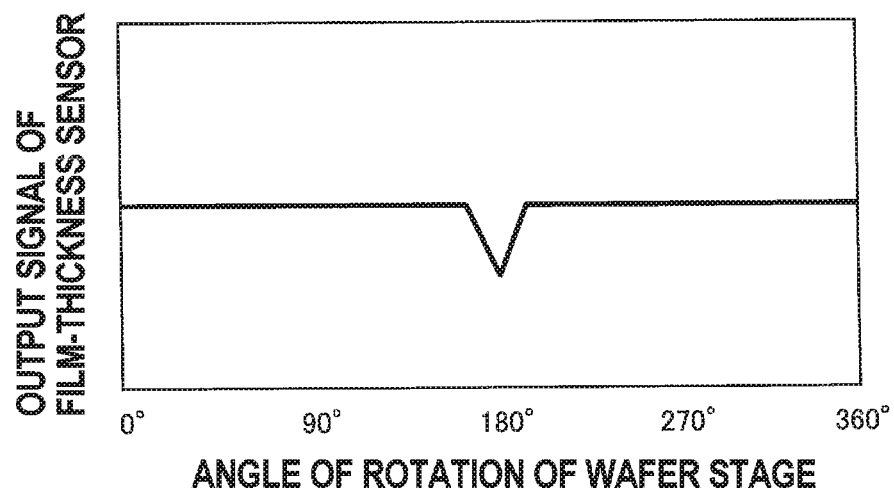
FIG. 34 is a graph showing a relationship between output signal of a first film-thickness sensor and angle of rotation of a wafer stage.

FIG. 34 is a graph showing a relationship between the output signal of the first film-thickness sensor 88 and the angle of rotation of the wafer stage 85. The data processor 110 can obtain the relationship between the output signal of the first film-thickness sensor 88 and the angle of rotation of the wafer stage 85, such as the one shown in FIG. 34. Based on a change in the output signal of the first film-thickness sensor (cut detection sensor) 88, the data processor 110 determines an angle of rotation of the wafer stage 85 which indicates the position of the notch 53. In the example shown in FIG. 34, the output signal of the first film-thickness sensor 88 makes a significant change when the angle of rotation of the wafer stage 85 is 180 degrees. Therefore, the data processor 110 determines that the angle of rotation of the wafer stage 85, which indicates the position of the notch 53, is 180 degrees. By using the position of the notch 53 as a reference, the data processor 110 can indicate the orientation of the wafer W in terms of the angle of rotation of the wafer stage 85.

In one embodiment, the second film-thickness sensor 89 may be used as a cut detection sensor instead of the first film-thickness sensor 88. Further, in one embodiment, a cut detection sensor may be provided in addition to the first film-thickness sensor 88 and the second film-thickness sensor 89. The cut detection sensor may be comprised of an eddy-current sensor, an optical sensor, an image sensor, or the like.

After completion of the association process for associating the orientation of the wafer W with the angle of rotation of the wafer stage 85, a profile-obtaining process for obtaining a film-thickness profile of the wafer W is performed. The profile-obtaining process is performed by measuring the film thickness with the first film-thickness sensor 88 and the second film-thickness sensor 89 at a plurality of measurement points on the surface of the wafer W while causing the two film-thickness sensors 88, 89 to traverse the surface of the wafer W once or a plurality of times. The center of the wafer W is preferably included among the measurement points on the surface of the wafer W.

A film-thickness profile which is obtained first is an initial film-thickness profile. While the film-thickness index values are being obtained for producing the initial film-thickness profile, the polishing disk 87 is not in contact with the wafer W, and the wafer W and the wafer stage 85 do not rotate.

Figure 35A:
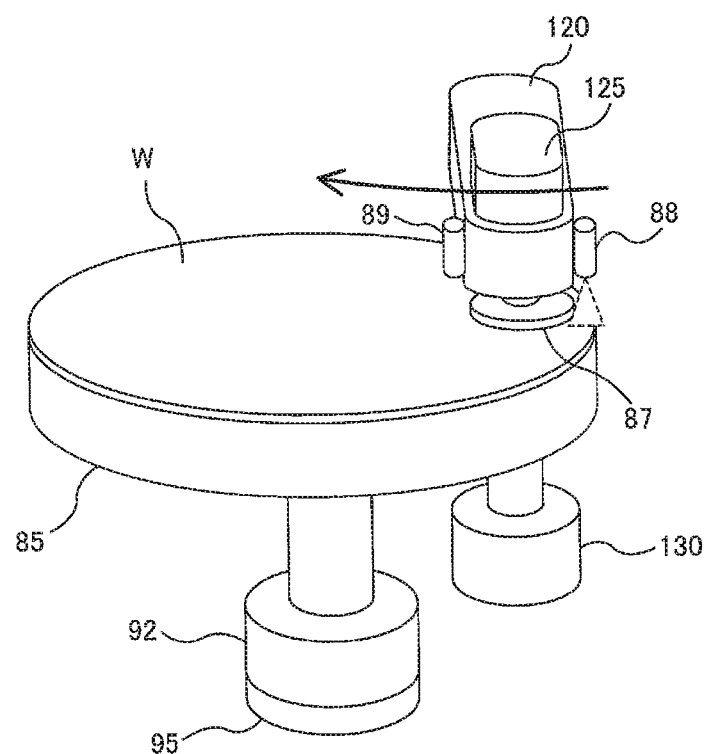
FIG. 35A is a diagram illustrating a manner in which only the first film-thickness sensor is operated to measure the film thickness of a wafer.
Figure 35B:
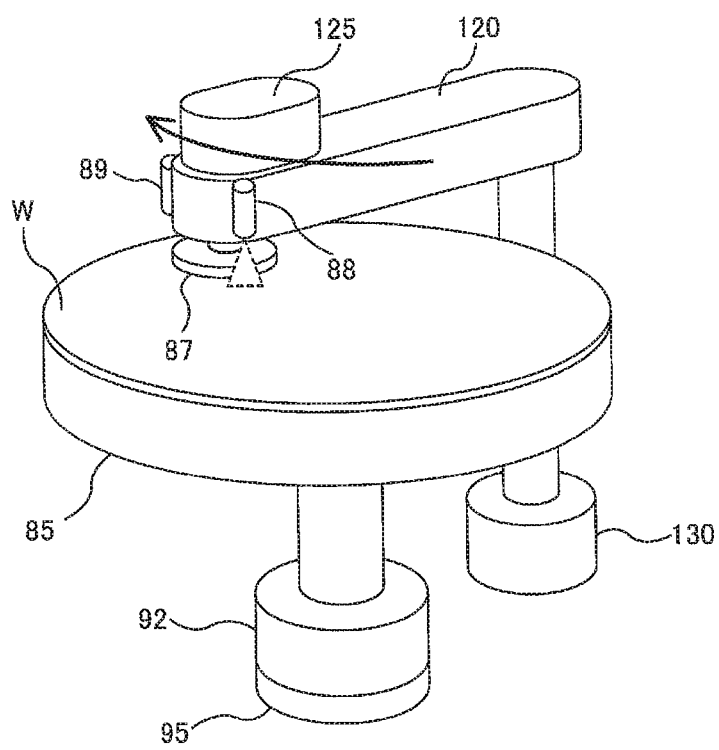
FIG. 35B is a diagram illustrating a manner in which only the first film-thickness sensor is operated to measure the film thickness of a wafer.

The first film-thickness sensor 88 and the second film-thickness sensor 89 alternately measure the film thickness. FIGS. 35A and 35B are diagrams illustrating the manner in which only the first film-thickness sensor 88 is operated to measure the film thickness of the wafer W. While traversing the surface of the wafer W, the first film-thickness sensor 88 measures the film thickness at a plurality of measurement points on the surface of the wafer W. More specifically, the first film-thickness sensor 88 starts to move from one edge of the wafer W, and stops moving when the second film-thickness sensor 89 reaches an opposite edge of the wafer W.

Figure 36A:
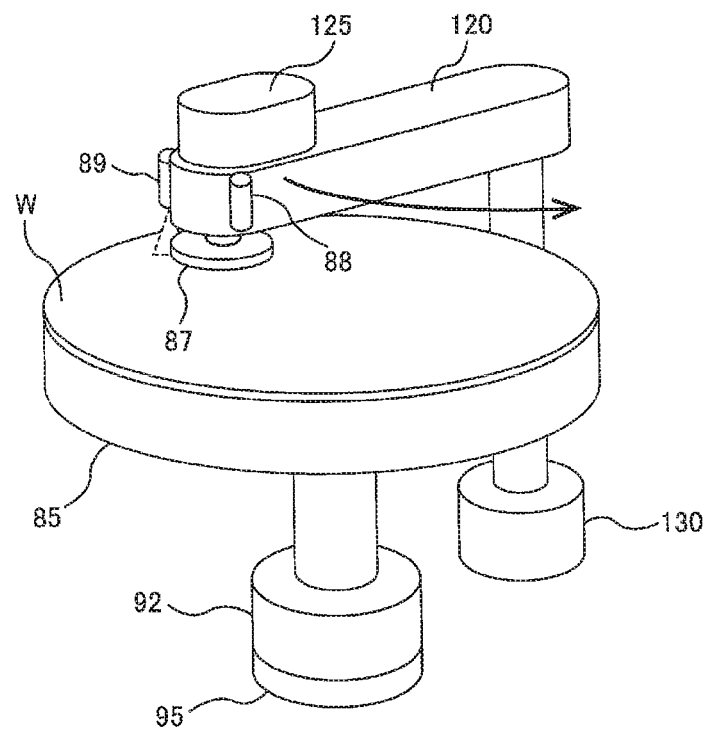
FIG. 36A is a diagram illustrating a manner in which only the second film-thickness sensor is operated to measure the film thickness of a wafer.
Figure 36B:
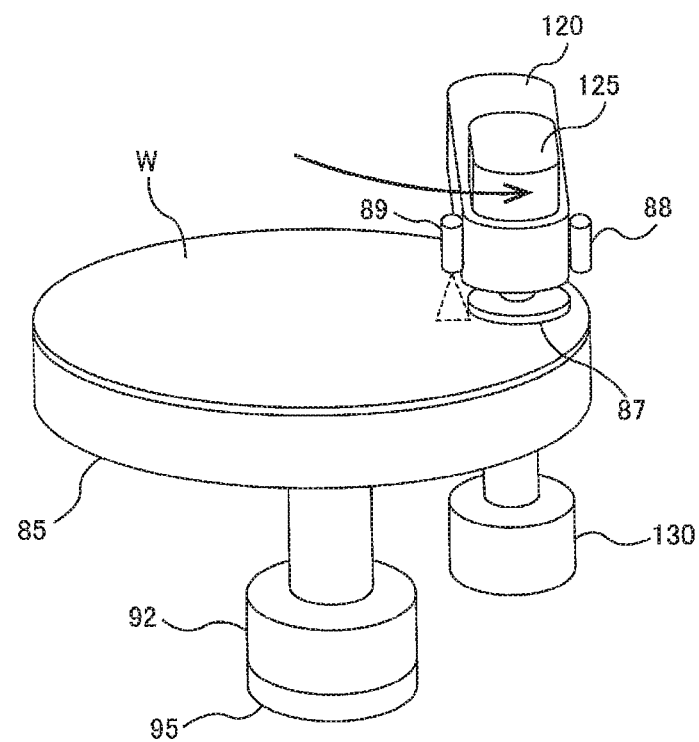
FIG. 36B is a diagram illustrating a manner in which only the second film-thickness sensor is operated to measure the film thickness of a wafer.

Next, only the second film-thickness sensor 89 is operated to measure the film thickness at a plurality of measurement points on the surface of the wafer W while traversing the surface of the wafer W. FIGS. 36A and 36B are diagrams illustrating only the second film-thickness sensor 89 is operated to measure the film thickness of the wafer W. The second film-thickness sensor 89 starts to move from the opposite edge of the wafer W, and stops moving when the first film-thickness sensor 88 reaches the one edge of the wafer W. In this manner, the first film-thickness sensor 88 and the second film-thickness sensor 89, while traversing the surface of the wafer W, alternately measure the film thickness.

Figure 37:
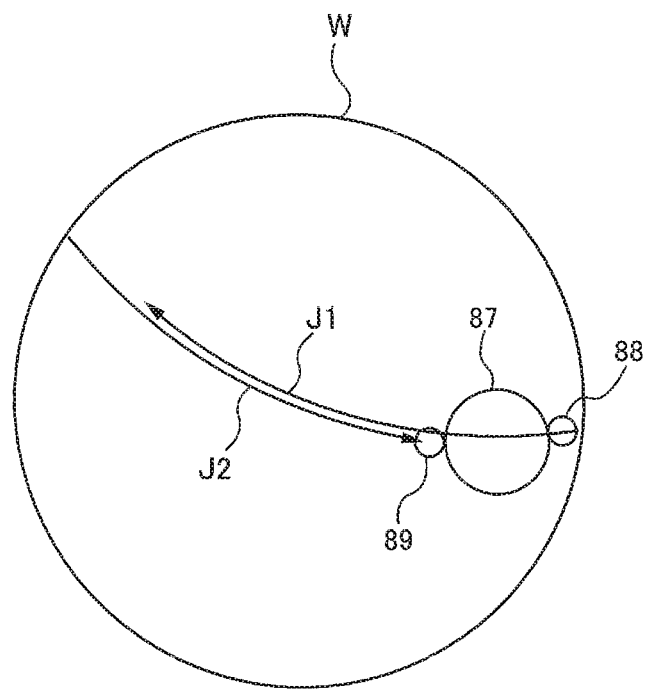
FIG. 37 is a diagram showing a movement path of the first film-thickness sensor and a movement path of the second film-thickness sensor.

FIG. 37 is a diagram showing a movement path of the first film-thickness sensor 88 and a movement path of the second film-thickness sensor 89. In FIG. 37, a symbol J1 denotes the movement path of the first film-thickness sensor 88, and a symbol J2 denotes the movement path of the second film-thickness sensor 89. As can be seen in FIG. 37, the use of the two film-thickness sensors 88, 89 enables the data processor 110 to produce a film-thickness profile that covers the range from one edge to an opposite edge of the wafer W. In order to produce the initial film-thickness profile, one of the first film-thickness sensor 88 and the second film-thickness sensor 89 may be moved from one edge to an opposite edge of the wafer W to measure the film thickness.

A film-thickness profile may be produced from film-thickness index values which are obtained while the first film-thickness sensor 88 and the second film-thickness sensor 89 are reciprocating once over the surface of the wafer W. Alternatively, a film-thickness profile may be produced from film-thickness index values which are obtained while the first film-thickness sensor 88 and the second film-thickness sensor 89 are reciprocating over the surface of the wafer W at a plurality of angles of rotation of the wafer W.

The data processor 110 produces a film-thickness distribution in the circumferential direction of the wafer W from a film-thickness profile(s). The film-thickness distribution is produced in the same manner as the process illustrated in FIGS. 7 through 10 or the process illustrated in FIGS. 11 through 14 in the above-described embodiments, and therefore a duplicate description thereof is omitted. The data processor 110 determines, based on the film-thickness distribution, a first area including a portion where the film thickness of the wafer W is largest or smallest. The first area can be specified by the angle of rotation of the wafer stage 85.

Figure 38:
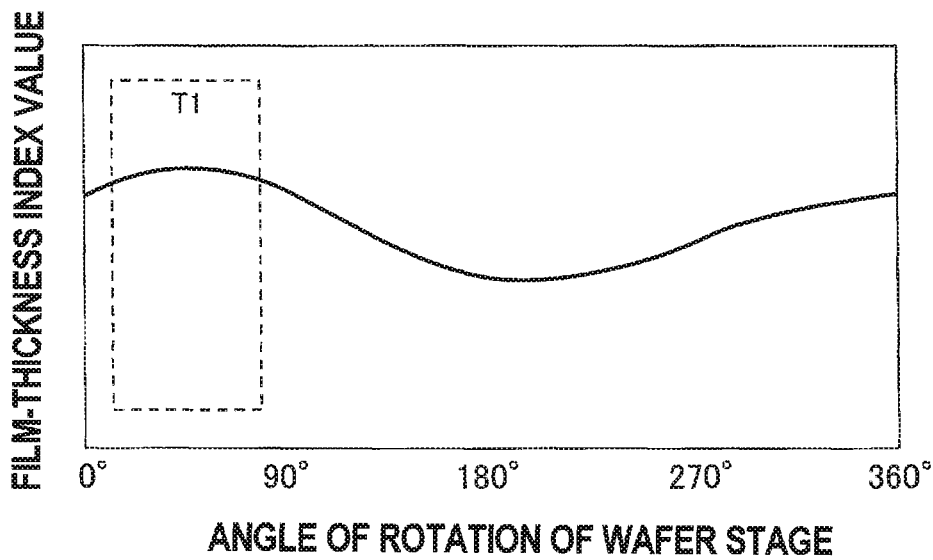
FIG. 38 is a diagram showing an example of a film-thickness distribution.
Figure 39:
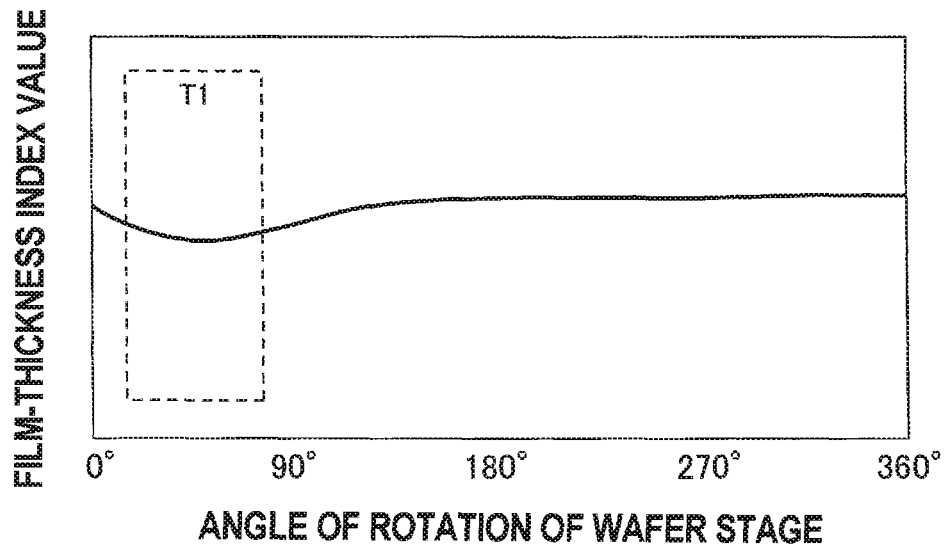
FIG. 39 is a diagram showing another example of a film-thickness distribution.

FIG. 38 is a diagram showing an example of a film-thickness distribution. In this example, the first area T1 is an area that includes a portion having the maximum film thickness, and is located at a position where the angle of rotation of the wafer stage 85 is 45°. FIG. 39 is a diagram showing another example of a film-thickness distribution. In this example, the first area T1 is an area that includes a portion having the minimum film thickness, and is located at a position where the angle of rotation of the wafer stage 85 is 45°.

The operation controller 112 determines a polishing condition that can make the film thickness equal between the first area and a second area which are symmetrical with respect to the center of the wafer W. The second area is a comparative area which is determined automatically according to the position of the first area, and can be any area as long as the first area and the second area are symmetrical with respect to the center of the wafer W. The first area, on the other hand, is a target area including a portion where the film thickness of the wafer W is largest or smallest, and has a film thickness different from that of the second area. Examples of the first area and the second area may include the first areas T1 and the second areas T2, shown in FIGS. 15 and 16, in the above-described embodiments.

The radial position of the first area on the surface of the wafer W can be determined from the film-thickness profile (see FIGS. 8 and 12), and the circumferential position of the first area on the surface of the wafer W can be determined from the film-thickness distribution (see FIGS. 38 and 39). The position of the first area is represented using coordinate areas which have been pre-defined on the surface of the wafer W. The coordinate areas are defined on a polar coordinate system whose origin is located on the center of the wafer W. The coordinate areas employed in this embodiment is approximately the same as the coordinate areas shown in FIG. 17. Specifically, the coordinate areas include areas arranged in the radial direction of the wafer W, and areas arranged in the circumferential direction of the wafer W.

After the determination of the first area, the surface of the wafer W is polished with the polishing disk 87. The polishing of the wafer W is performed by oscillating the rotating polishing disk 87 on the surface of the wafer W a plurality of times while rotating the wafer W with the wafer stage 85. During polishing of the wafer W, the wafer stage 85 is rotated at a higher rotational speed than that of the polishing disk 87. During polishing of the wafer W, the two film-thickness sensors 88, 89 alternately measure the film thickness while they are oscillating together with the polishing disk 87, as described above, and transmit to the data processor 110 the film-thickness index values as the film-thickness data obtained at varying rotational angles of the wafer stage 85 and varying oscillating positions of the operating film-thickness sensor 88 or 89.

In order to eliminate the variation in the film thickness along the circumferential direction of the wafer W, the first area is polished at a removal rate different from that of the second area. A description will now be given of an embodiment of a polishing method which polishes the first area at a removal rate different from that of the second area. In this embodiment, the relative speed between the first area and the polishing disk 87 is increased when the polishing disk 87 is in contact with the first area. For example, while the wafer stage 85 and the wafer W are rotating at a higher rotational speed than that of the polishing disk 87, the rotational speed of the polishing disk 87 is decreased when the polishing disk 87 is in contact with the first area, thereby increasing the relative speed between the first area and the polishing disk 87. The rotational speed of the polishing disk 87 can be changed by the disk motor 122 shown in FIG. 32.

Figure 40:
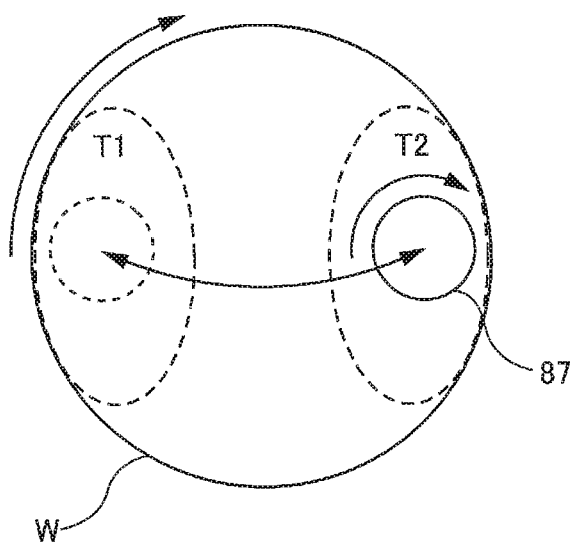
FIG. 40 is a plan view showing the polishing disk when it is located on one side of a surface of a wafer.
Figure 40:
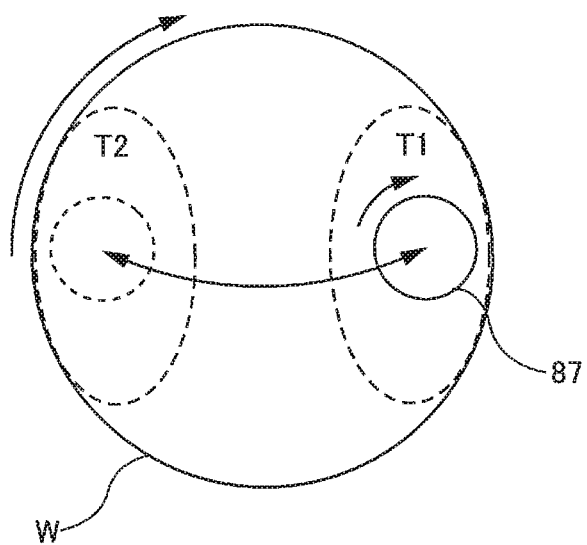
Figure 41:
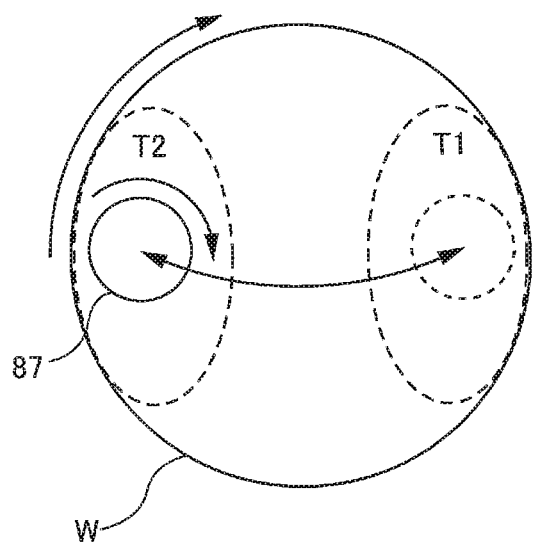
FIG. 41 is a plan view showing the polishing disk when it is located on the opposite side of the surface of the wafer.
Figure 41:
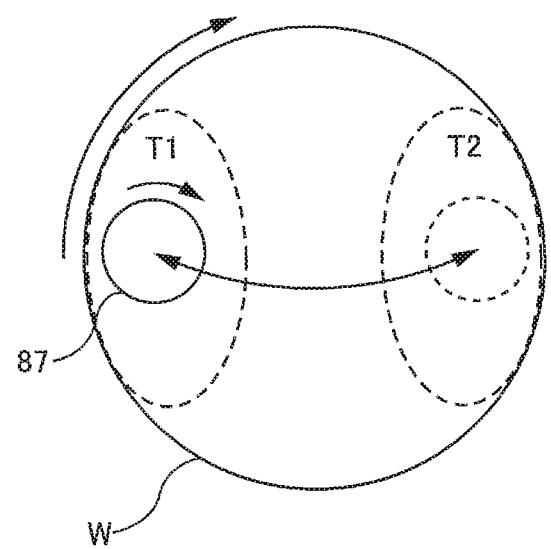

FIG. 40 is a plan view showing the polishing disk 87 when it is located on one side of the surface of the wafer W, and FIG. 41 is a plan view showing the polishing disk 87 when it is located on the opposite side of the surface of the wafer W. While the wafer stage 85 and the wafer W are rotating at a higher rotational speed than that of the polishing disk 87, the rotational speed of the polishing disk 87 is decreased when the polishing disk 87 is in contact with the first area T1. Further, when the polishing disk 87 leaves the first area T1, the rotational speed of the polishing disk 87 is increased to become closer to the rotational speed of the wafer stage 85 and the wafer W. The relative speed between the first area and the polishing disk 87 is higher than the relative speed between the second area and the polishing disk 87. By thus periodically increasing the relative speed between the polishing disk 87 and the wafer W according to the rotation of the wafer W, the removal rate of the particular first area T1 can be increased. Accordingly, the polishing disk 87 can polish the first area T1 at a higher removal rate than that of the second area T2.

In one embodiment, the relative speed between the first area T1 and the polishing disk 87 may be increased by making the rotational speed of the polishing disk 87 higher than the rotational speed of the wafer stage 85 and the wafer W when the polishing disk 87 is in contact with the first area T1.

Figure 42:
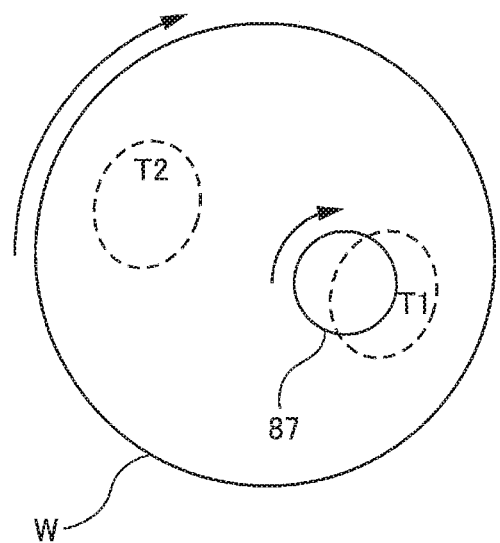
FIG. 42 is a diagram illustrating an embodiment in which when the polishing disk is in contact with a first area and located inwardly relative to the first area, the rotational speed of the polishing disk is decreased.
Figure 43:
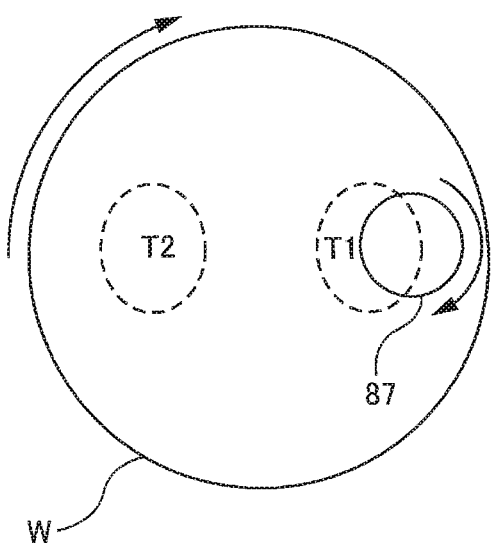
FIG. 43 is a diagram illustrating an embodiment in which when the polishing disk is in contact with the first area and located outwardly relative to the first area, the rotational speed of the polishing disk is increased to become closer to the rotational speed of the wafer stage and the wafer.

While the wafer stage 85 and the wafer W are rotating at a higher rotational speed than that of the polishing disk 87, the rotational speed of the polishing disk 87 may be decreased when the polishing disk 87 is in contact with the first area T1 and is located inwardly relative to the first area T1 as shown in FIG. 42. Further, the rotational speed of the polishing disk 87 may be increased when the polishing disk 87 is in contact with the first area T1 and is located outwardly relative to the first area T1 as shown in FIG. 43. Such operations can also increase the relative speed between the first area T1 and the polishing disk 87. Accordingly, the polishing disk 87 can polish the first area T1 at a higher removal rate than that of the second area T2.

When the wafer W has the film-thickness distribution shown in FIG. 39, the film thickness of the first area T1 and the film thickness of the second area T2 can simultaneously approach target film thickness by polishing the first area T1 at a lower removal rate than that of the second area T2. In this case, therefore, the rotational speed of the polishing disk 87 is brought closer to the rotational speed of the wafer stage 85 and the wafer W when the polishing disk 87 is in contact with the first area T1. This operation can decrease the relative speed between the first area T1 and the polishing disk 87, and therefore the polishing disk 87 can polish the first area T1 at a lower removal rate than that of the second area T2.

A description will now be given of another embodiment of a polishing method which polishes the first area T1 at a removal rate different from that of the second area T2. In this embodiment, a load of the polishing disk 87 is increased when the polishing disk 87 is in contact with the first area T1. The load of the polishing disk 87 can be changed by the disk pressing device 125 shown in FIG. 32.

Figure 44:
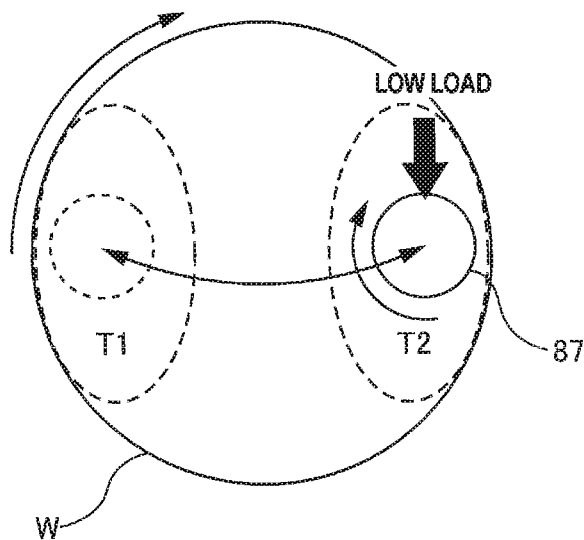
FIG. 44 is a plan view showing the polishing disk when it is located on one side of a surface of a wafer.
Figure 44:
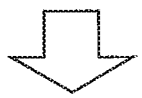
Figure 44:
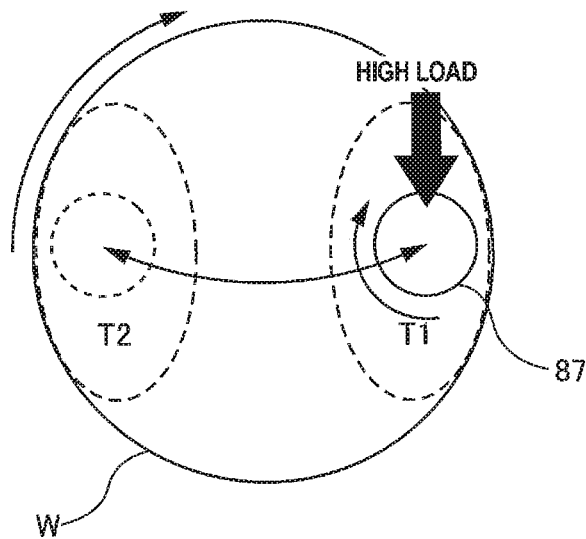
Figure 45:
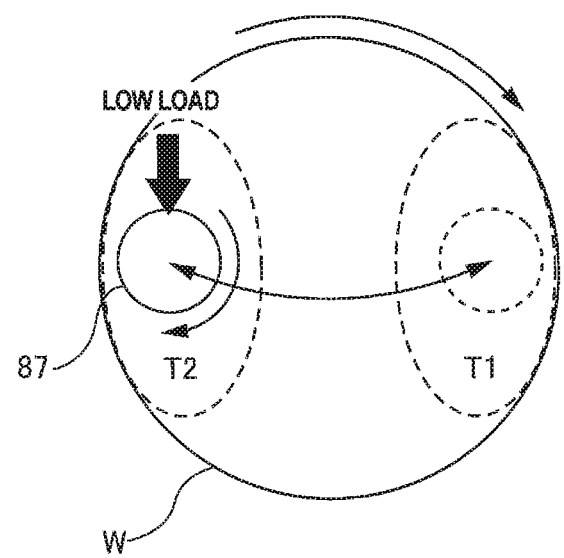
FIG. 45 is a plan view showing the polishing disk when it is located on the opposite side of the surface of the wafer.
Figure 45:
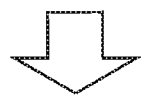
Figure 45:
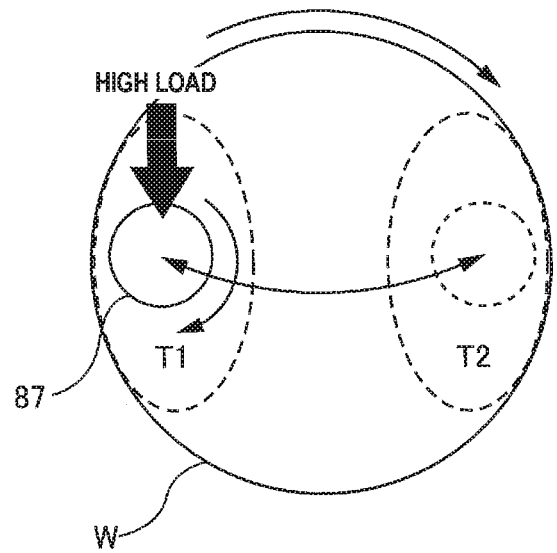

FIG. 44 is a plan view showing the polishing disk 87 when it is located on one side of the surface of the wafer W, and FIG. 45 is a plan view showing the polishing disk 87 when it is located on the opposite side of the surface of the wafer W. The load of the polishing disk 87 is increased when the polishing disk 87 is in contact with the first area T1. Further, the load of the polishing disk 87 is decreased when the polishing disk 87 leaves the first area T1. The load of the polishing disk 87, when it is in contact with the first area T1, is higher than that when the polishing disk 87 is in contact with the second area T2. By thus periodically increasing the load of the polishing disk 87 according to the rotation of the wafer W, the removal rate of the particular first area T1 can be increased. Accordingly, the polishing disk 87 can polish the first area T1 at a higher removal rate than that of the second area T2.

When the wafer W has the film-thickness distribution shown in FIG. 39, the film thickness of the first area T1 and the film thickness of the second area T2 can simultaneously approach target film thickness by polishing the first area T1 at a lower removal rate than that of the second area T2. In this case, therefore, the load of the polishing disk 87 is decreased when the polishing disk 87 is in contact with the first area T1. Such an operation enables the polishing disk 87 to polish the first area T1 at a lower removal rate than that of the second area T2.

The film-thickness distribution of the wafer W changes with the progress of polishing of the wafer W, and the position of the first area T1 can change accordingly. Therefore, the data processor 110 may update the film-thickness distribution during polishing of the wafer W, while the operation controller 112 may optimize a polishing condition based on the updated film-thickness distribution. For example, during polishing of the wafer W, the data processor 110 obtains and updates the film-thickness distribution each time the polishing disk 87 reciprocates (oscillates) on the surface of the wafer W a predetermined number of times (e.g. five times), and the operation controller 112 optimizes a polishing condition based on the updated film-thickness distribution.

In one embodiment, during polishing of the wafer W, the operation controller 112 optimizes a polishing condition each time the film-thickness distribution is updated, and operates the polishing-condition adjusting system 113 according to the optimized polishing condition, and the wafer W is polished under the optimized polishing condition. The polishing-condition adjusting system 113 is composed of the disk pressing device 125, the disk motor 122, etc.

The above-discussed buffing apparatus 200 may be used either singly or in combination with the above-discussed chemical mechanical polishing (CMP) apparatus 100. In the case of using the buffing apparatus 200 in combination with the CMP apparatus 100, the CMP apparatus 100 is used as a main polishing apparatus for polishing an entire surface of a wafer, and the buffing apparatus 200 is used as a finish-polishing apparatus for finish-polishing the wafer surface that has been polished by the CMP apparatus 100.

Figure 46:
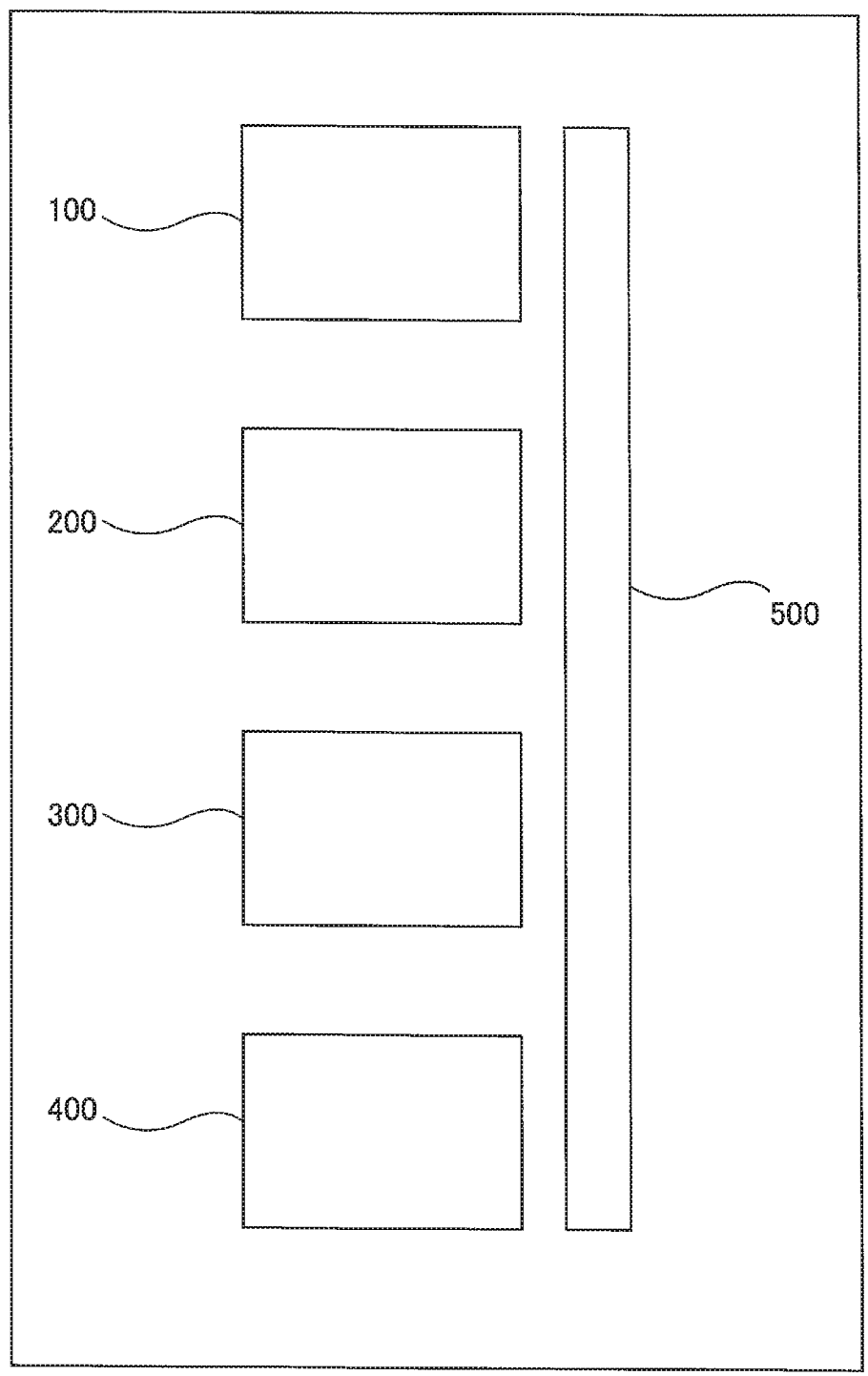
FIG. 46 is a schematic view of a composite polishing system including a chemical mechanical polishing (CMP) apparatus and a buffing apparatus.

FIG. 46 is a schematic view of a composite polishing system including the chemical mechanical polishing (CMP) apparatus 100 and the buffing apparatus 200. As shown in FIG. 46, the composite polishing system includes the chemical mechanical polishing (CMP) apparatus 100 as a main polishing apparatus for polishing an entire surface of a wafer, the buffing apparatus 200 as a finish-polishing apparatus for performing finish-polishing of the wafer surface which has been polished by the CMP apparatus 100, a cleaning unit 300 for cleaning the wafer which has been polished by the buffing apparatus 200, a drying unit 400 for drying the cleaned wafer, and a transport device 500 for transporting the wafer between the CMP apparatus 100, the buffing apparatus 200, the cleaning unit 300, and the drying unit 400. The arrangement of the CMP apparatus 100, the buffing apparatus 200, the cleaning unit 300, and the drying unit 400 is not limited to the embodiment illustrated in FIG. 46, and other arrangement may be applied.

The CMP apparatus 100 performs a first-stage polishing process of polishing the entire surface, including the above-described first and second areas, of the wafer, and the buffing apparatus 200 performs a second-stage polishing process of finish-polishing the surface of the wafer after the first-stage polishing process. A sequence of operations in the composite polishing system will now be described with reference to FIG. 47.

Figure 47:
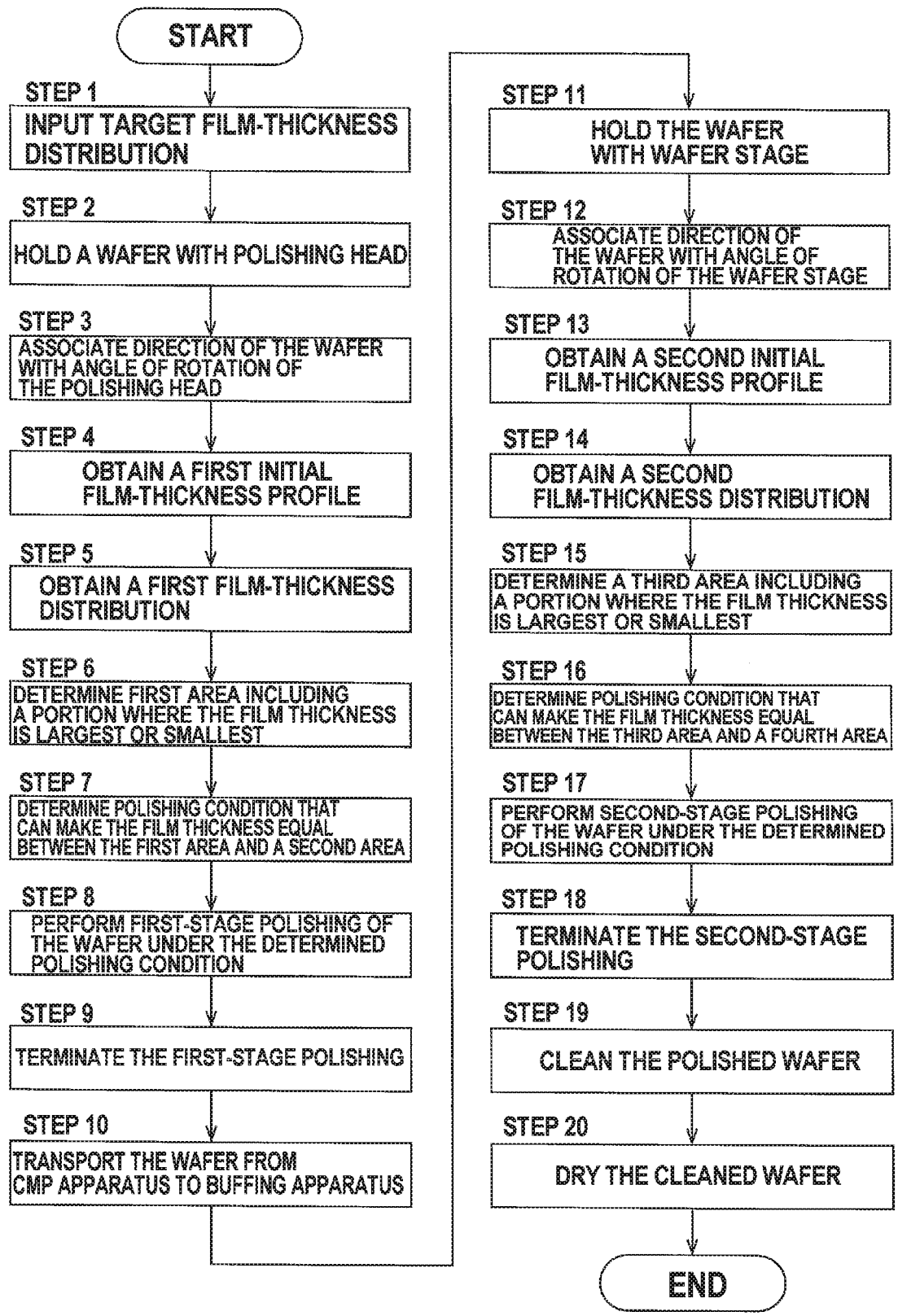
FIG. 47 is a flow chart showing a sequence of operations of the composite polishing system.

FIG. 47 is a flow chart showing a sequence of operations of the composite polishing system. First, in step 1, a target film-thickness distribution of a wafer is inputted into and stored in the operation controller 7 of the CMP apparatus 100. In step 2, the wafer, to be polished, is held by the polishing head 1 of the CMP apparatus 100. In step 3, a position of a notch of the wafer is detected, and the association process for associating the orientation of the wafer with the angle of rotation of the polishing head 1 is performed (see FIGS. 4 through 6).

In step 4, a first initial film-thickness profile, which indicates the relationship between initial film-thickness index value and radial position on the wafer, is obtained. The obtaining of the first initial film-thickness profile is performed while the wafer is pressed against the polishing pad 2 at a low load. More specifically, the obtaining of the first initial film-thickness profile is performed by the process illustrated in FIGS. 7 and 8 or the process illustrated in FIGS. 11 and 12.

In step 5, a first film-thickness distribution, which is the distribution of film-thickness index values (i.e. the distribution of film thicknesses) in the circumferential direction of the wafer, is obtained from the first initial film-thickness profile. The obtaining of the first film-thickness distribution is performed by the process illustrated in FIGS. 9 and 10 or the process illustrated in FIGS. 13 and 14. In step 6, a first area including a portion where the film thickness of the wafer is largest or smallest is determined based on the first film-thickness distribution.

In step 7, a polishing condition is determined which can make the film thickness equal between the first area and a second area which are symmetrical with respect to the center of the wafer. The second area is a comparative area which is determined automatically according to the position of the first area, and can be any area as long as the first area and the second area are symmetrical with respect to the center of the wafer.

In step 8, a first-stage polishing process of the wafer is performed under the determined polishing condition. Film-thickness profiles are continually obtained during polishing of the wafer, and the first film-thickness distribution is updated based on a newly obtained film-thickness profile. Further, a polishing condition is optimized based on the updated first film-thickness distribution. In this manner, during polishing of the wafer, the updated first film-thickness distribution is fed back to the determination of a polishing condition.

In step 9, the first-stage polishing process of the wafer is terminated when the first target film-thickness distribution is reached or when a predetermined polishing time has elapsed. In step 10, the polished wafer is transported from the CMP apparatus 100 to the buffing apparatus 200 by the transport device 500.

In step 11, the wafer, with its polished surface facing upward, is held on the wafer stage 85 of the buffing apparatus 200. In step 12, a position of a notch of the wafer is detected, and the association process for associating the orientation of the wafer with the angle of rotation of the wafer stage 85 is performed (see FIGS. 33 and 34).

In step 13, a second initial film-thickness profile, which indicates the relationship between initial film-thickness index value and radial position on the wafer, is obtained. In step 14, a second film-thickness distribution, which is the distribution of film-thickness index values (i.e. the distribution of film thicknesses) in the circumferential direction of the wafer which has been polished in the first-stage polishing process, is obtained from the second initial film-thickness profile. The obtaining of the second initial film-thickness profile and the obtaining of the second film-thickness distribution are performed in the same manner as the process illustrated in FIGS. 7 through 10 or the process illustrated in FIGS. 11 through 14. In step 15, a third area including a portion where the film thickness of the wafer is largest or smallest is determined based on the second film-thickness distribution.

In step 16, a polishing condition is determined which can make the film thickness equal between the third area and a fourth area which are symmetrical with respect to the center of the wafer. The fourth area is a comparative area which is determined automatically according to the position of the third area, and can be any area as long as the third area and the fourth area are symmetrical with respect to the center of the wafer. The third area and the fourth area correspond to the first area T1 and the second area T2, respectively, which have been described above with reference to the embodiments of the buffing apparatus 200 shown in FIGS. 31 through 45. Thus, the third area and the fourth area are symmetrical with respect to the center of the wafer W.

In step 17, a second-stage polishing process of the wafer is performed under the determined polishing condition. Film-thickness profiles are continually obtained during polishing of the wafer, and the second film-thickness distribution is updated based on a newly obtained film-thickness profile. Further, a polishing condition is optimized based on the updated second film-thickness distribution. In this manner, during polishing of the wafer, the updated second film-thickness distribution is fed back to the determination of a polishing condition.

In step 18, the second-stage polishing process of the wafer is terminated when the second target film-thickness distribution is reached or when a predetermined polishing time has elapsed. In step 19, the polished wafer is transported by the transport device 500 from the buffing apparatus 200 to the cleaning unit 300, where the polished wafer is cleaned. In step 20, the cleaned wafer is transported by the transport device 500 from the cleaning unit 300 to the drying unit 400, where the cleaned wafer is dried. In this manner, a sequence of wafer processing steps, including the first-stage polishing process, the second-stage polishing process, the cleaning process, and the drying process, are performed.

The foregoing description is presented to enable a person of ordinary skill in the art to make and use the invention. Various modifications to the embodiments described above will be readily apparent to those of ordinary skill in the art and the technical concept of the present invention may be applied to other embodiments. Accordingly, the present invention is not intended to be limited to the embodiments illustrated but is to be accorded the widest scope consistent with the technical concept defined by the appended claims.

INDUSTRIAL APPLICABILITY

The present invention is applicable to a method and an apparatus for polishing a surface of a substrate.

REFERENCE SIGNS LIST 1 polishing head (substrate holder)
2 polishing pad
2a polishing surface
3 polishing table
5 slurry supply nozzle
6 data processor
7 operation controller
8 polishing-condition adjusting system
11 head shaft
12 rotary cylinder
13 table motor
14 timing pulley
15 film-thickness sensor
16 head arm
18 head rotating motor
19 timing belt
20 timing pulley
21 head arm shaft
22 rotary encoder
25 rotary joint
26 bearing
27 vertically moving mechanism
28 bridge
29 support base
30 pillars
32 ball screw
32a screw shaft
32b nut
38 servo motor
41 head body
42 retainer ring
44 elastic membrane
44a wafer-contact surface (substrate-contact surface)
45 membrane holder
50 gas supply source
51 cut detection sensor
53 notch
61 head-decentering mechanism
63 rod
64 universal joint
66 elevating device
67 annular disk
71 roller
72 rack
73 pinion
75 servo motor
79 partition membrane
85 wafer stage (substrate stage)
87 polishing disk
88, 89 film-thickness sensor
91 stage shaft
92 stage motor
95 rotary encoder
97 polishing cloth
97a polishing surface
100 chemical mechanical polishing (CMP) apparatus
110 data processor
112 operation controller
113 polishing-condition adjusting system
120 disk arm
121 disk shaft
122 disk motor
123 torque transmitting mechanism
125 disk pressing device
128 disk arm shaft
130 disk pivoting motor
200 buffing apparatus
300 cleaning unit
400 drying unit
500 transport device
P1, P2, P3, P4, P5, P6 pressure chamber
P5-1, P5-2, P5-3 actuating chamber
F1, F2, F3, F4, F5, F6, F5-1, F5-2, F5-3 gas delivery line
R1, R2, R3, R4, R5, R6, R5-1, R5-2, R5-3 pressure regulator
T1 first area
T2 second area
L central axis of rotation
W wafer

The invention claimed is:

1. A polishing apparatus comprising:
a polishing table supporting a polishing pad;
a polishing head configured to press a substrate against the polishing pad;

a head rotating motor configured to rotate the polishing head about a central axis of rotation; and a head-decentering mechanism configured to decenter the polishing head from the central axis of rotation, wherein the head-decentering mechanism is configured to decenter the polishing head in a direction in which a distance of a first area in a surface of the substrate from the central axis of rotation of the polishing head increases or decreases such that the polishing head can polish the first area at a removal rate different from that of a second area in the surface of the substrate.

2. The polishing apparatus according to claim 1, wherein the first area and the second area are symmetrical with respect to a center of the substrate.

3. A polishing apparatus comprising:

a polishing table supporting a polishing pad; and a polishing head configured to press a substrate against the polishing pad, the polishing head including:

a head body;

an elastic membrane configured to press the substrate against the polishing pad;

a membrane holder holding the elastic membrane;

at least three partition membranes that form at least three actuating chambers between the head body and the membrane holder; and at least three pressure regulators configured to control pressures in the at least three actuating chambers independently of each other to incline the membrane holder in a desired direction, wherein the membrane holder is inclined upwardly or downwardly in a direction from a first area toward a second area in a surface of the substrate to enable the polishing head to polish the first area at a removal rate different from that of the second area.

4. The polishing apparatus according to claim 3, wherein the first area and the second area are symmetrical with respect to a center of the substrate.

* * * * *